(12) United States Patent
Taura et al.

(10) Patent No.: US 6,310,483 B1
(45) Date of Patent: *Oct. 30, 2001

(54) LONGITUDINAL TYPE HIGH FREQUENCY PROBE FOR NARROW PITCHED ELECTRODES

(75) Inventors: Toru Taura; Hirobumi Inoue; Masao Tanehashi; Kouji Matsunaga, all of Tokyo; Yuuichi Yamagishi, Kanagawa; Satoshi Hayakawa, Kanagawa; Hironori Tsugane, Kanagawa, all of (JP)

(73) Assignees: NEC Corporation; Anritsu Corporation, both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/183,883

(22) Filed: Oct. 30, 1998

(30) Foreign Application Priority Data

Oct. 31, 1997 (JP) .................................................... 9-301189

(51) Int. Cl.⁷ .................................................. G01R 31/02
(52) U.S. Cl. .......................... 324/754; 324/755; 324/762
(58) Field of Search .................................... 324/754, 755, 324/762

(56) References Cited

U.S. PATENT DOCUMENTS 5,373,231 * 12/1994 Boll .................................... 324/158.1
5,506,515 * 4/1996 Godshalk .............................. 324/762
5,565,788 * 10/1996 Burr et al. ............................ 324/762

FOREIGN PATENT DOCUMENTS

| 2242165 | 9/1990 | (JP) . |
| 0634715 | 2/1994 | (JP) . |
| 7311220 | 11/1995 | (JP) . |
| 8304457 | 11/1996 | (JP) . |

* cited by examiner

Primary Examiner—Safet Metjahic
Assistant Examiner—James Kerveros
(74) Attorney, Agent, or Firm—Ostrolenk, Faber, Gerb & Soffen, LLP

(57) ABSTRACT

A high-frequency probe according to the present invention comprises a probe chip that has an end part that is pressed to an electrode and is covered by a electrically conductive outer enclosure, and slides in a vertical direction by an inner surface of this electrically conductive outer enclosure inside this electrically conductive outer enclosure. A signal conductive pattern is fixed inside this probe chip and is connected with a inner conductor having elasticity. The inner conductor can be bent in the vertical direction at a central part of a hole having an opening, which is sufficiently long in the vertical direction, in the center space of a ground conductor, which is fixed to an end part of the main block, when the inner conductor is pressed due to contact of the end part. In addition, the high-frequency probe has a thin shape of a maximum thickness in a transverse direction which is perpendicular to the vertical direction that is a direction of the probe being pressed to a device electrode. The maximum thickness is substantially equal to a pitch between device electrodes, and can be formed in the construction of unifying a plurality of high-frequency probes.

27 Claims, 21 Drawing Sheets

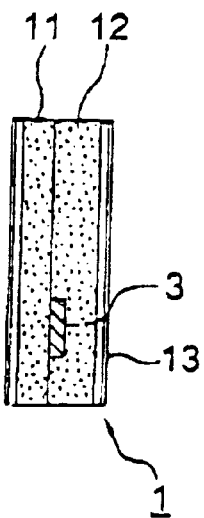
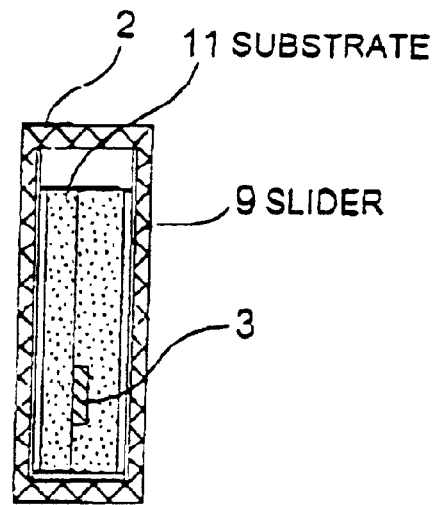
FIG. 8A        FIG. 8B
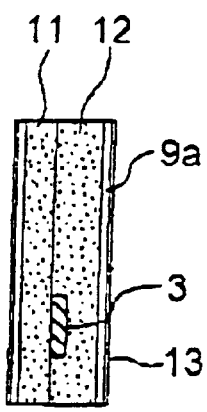
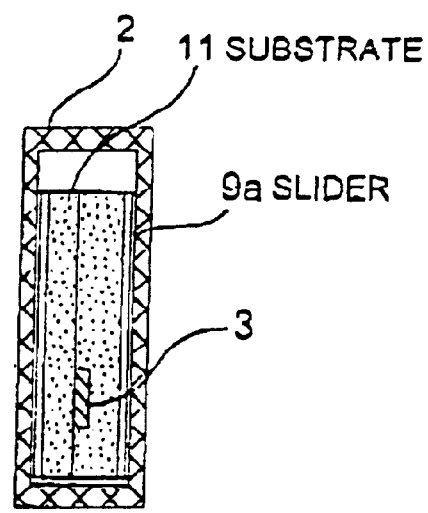
FIG. 9A        FIG. 9B

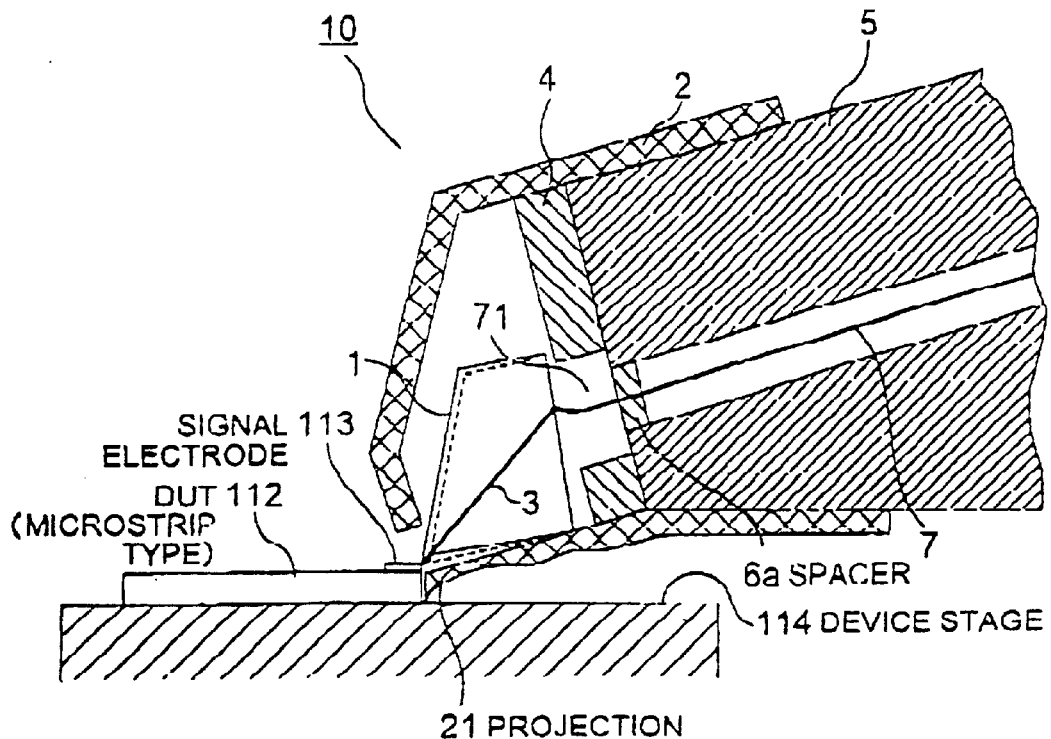
FIG. 11
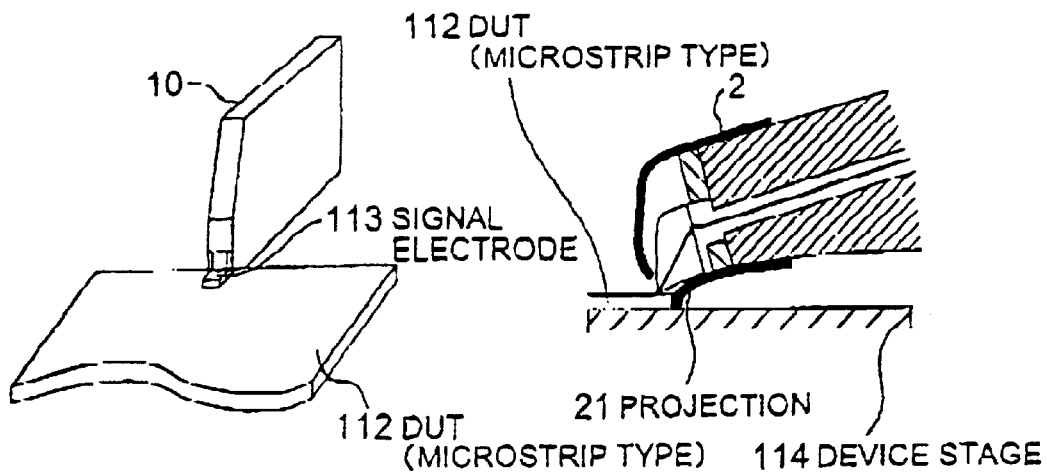
FIG. 12A      FIG. 12B

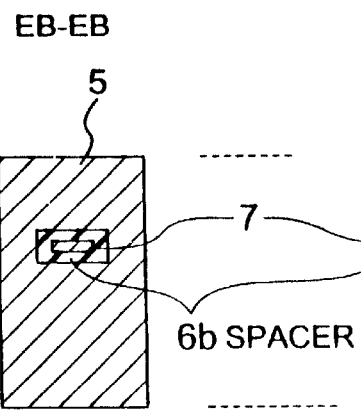
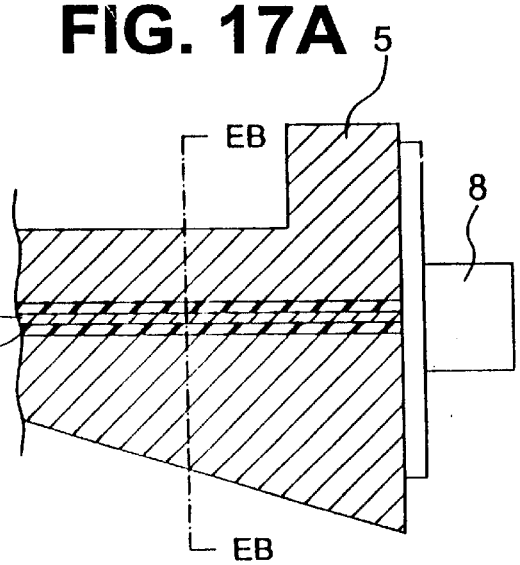
FIG. 17B EB-EB
FIG. 17A
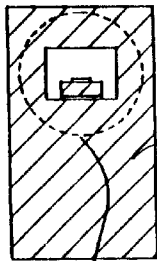
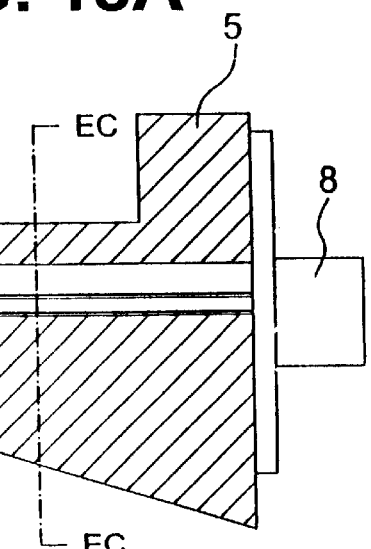
FIG. 18B EC-EC
FIG. 18A
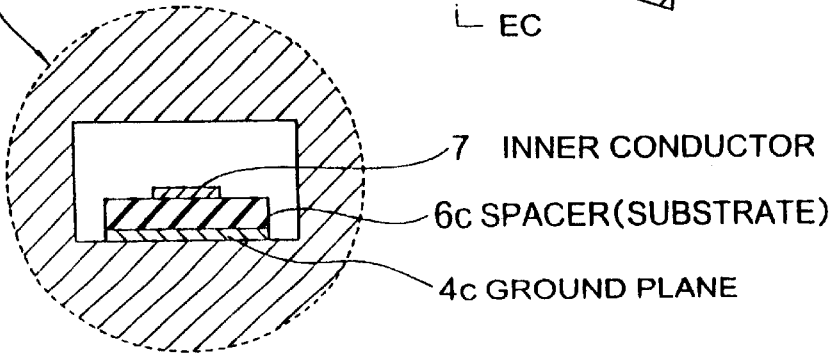
FIG. 18C

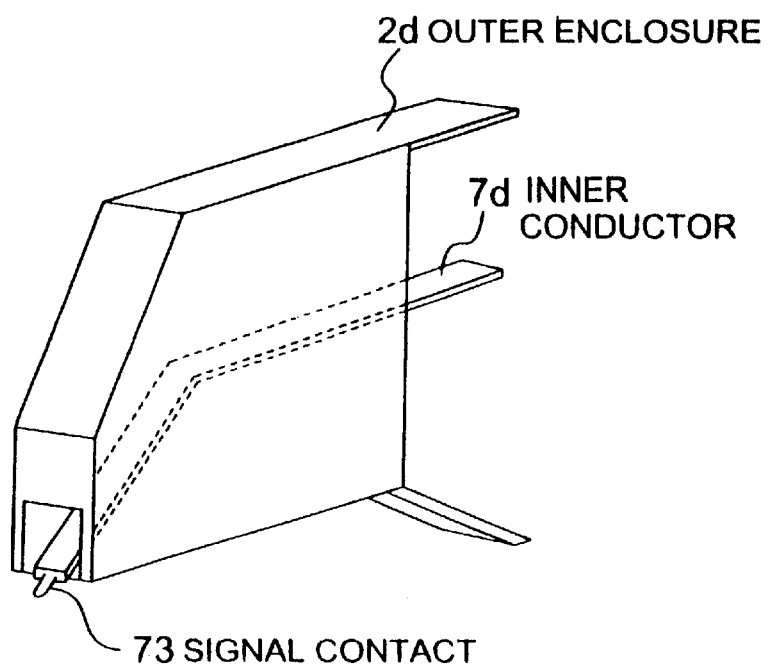
FIG. 19
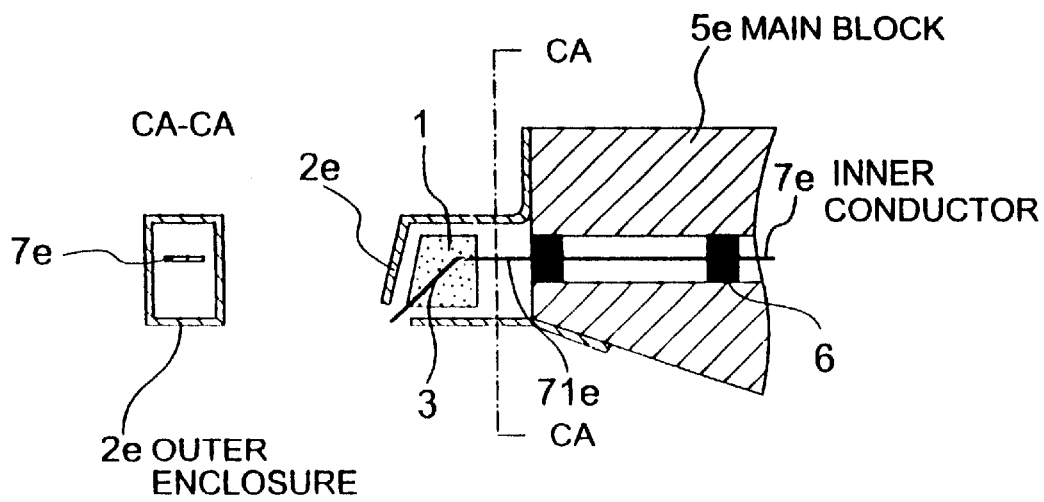
FIG. 20B      FIG. 20A

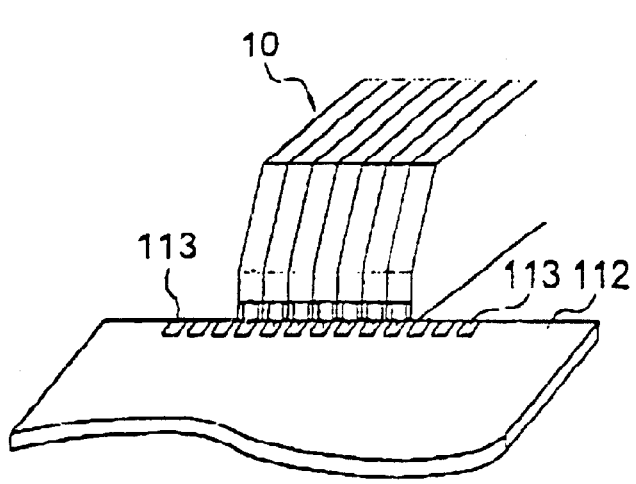
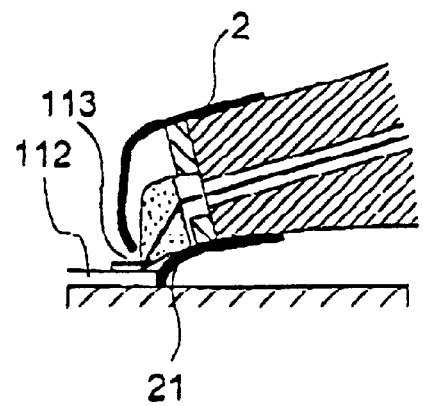
FIG. 21A        FIG. 21B
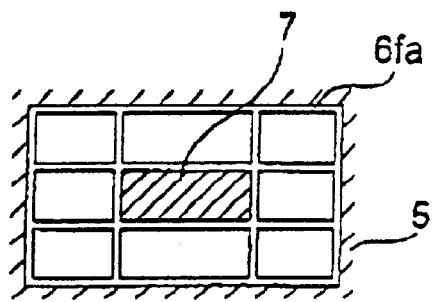
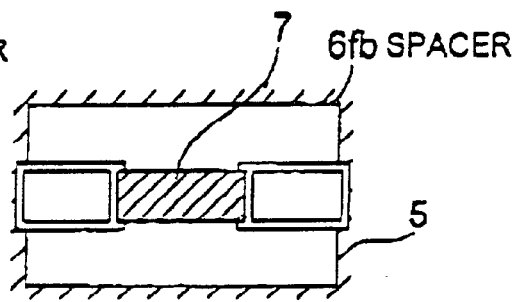
FIG. 22A        FIG. 22B

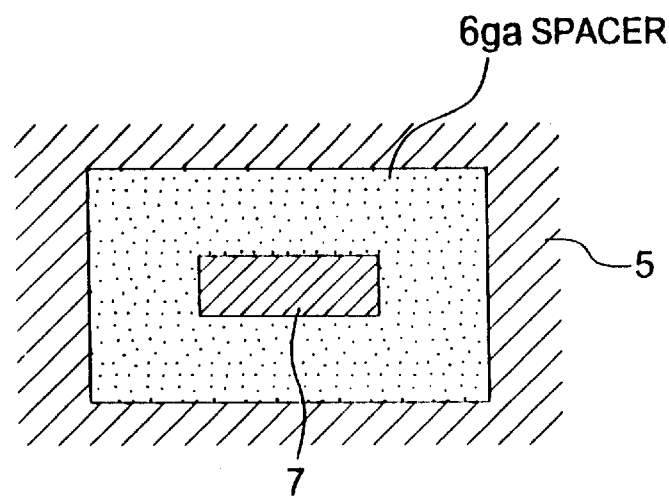
FIG. 22C
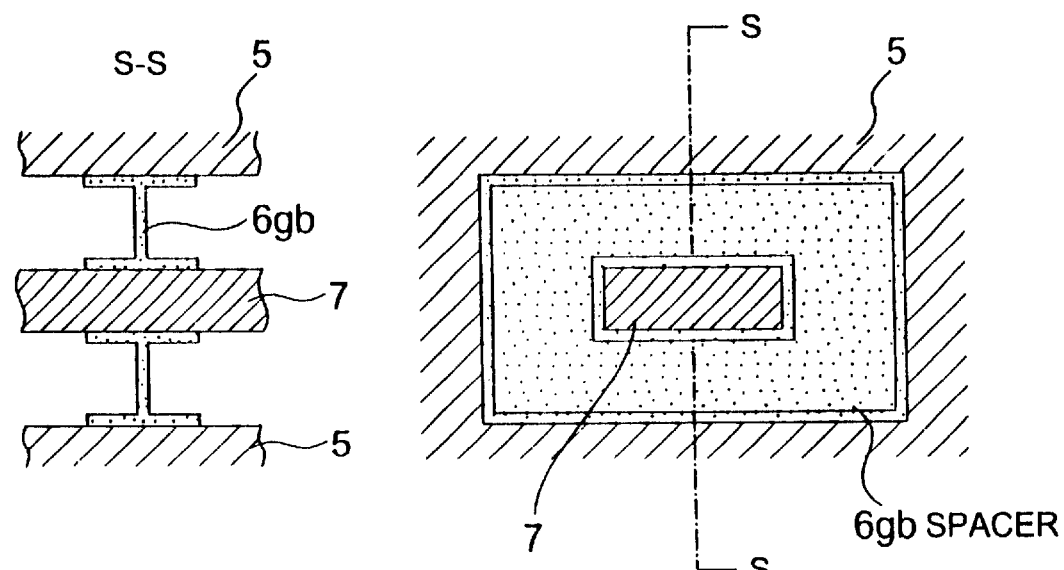
FIG. 22E
FIG. 22D

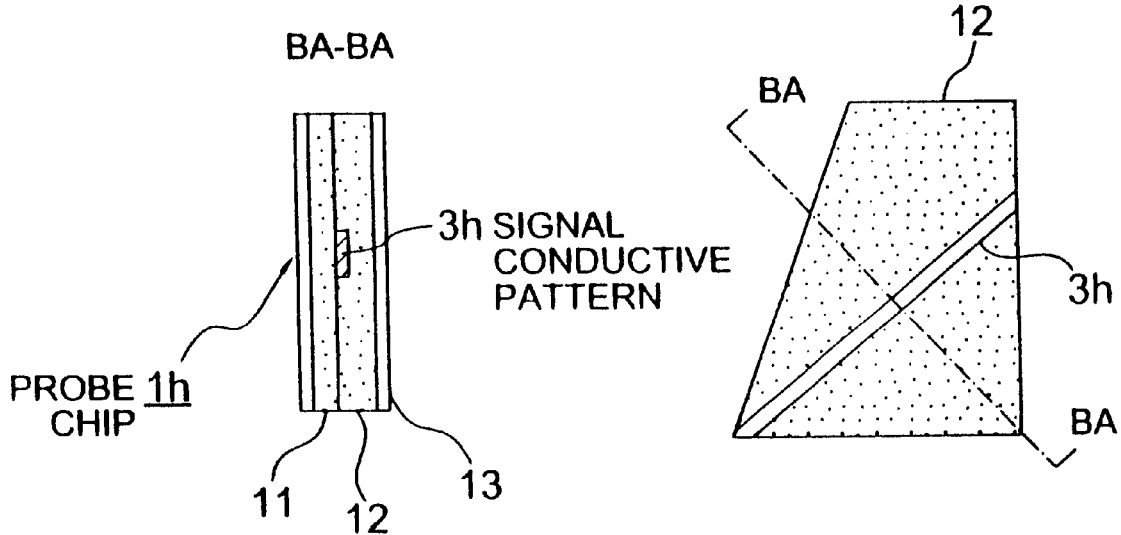
FIG. 24B  FIG. 24A
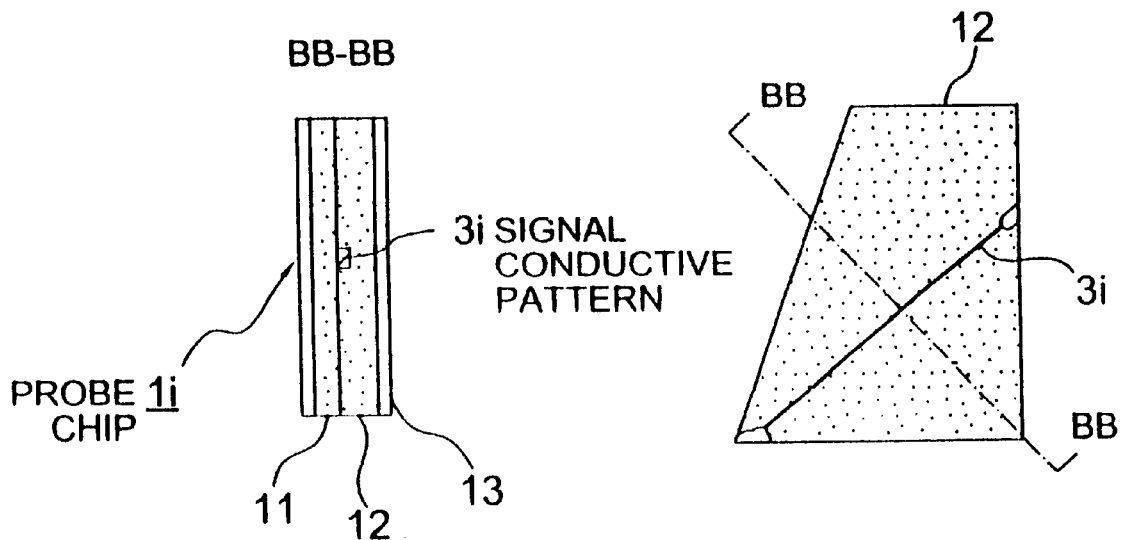
FIG. 24D  FIG. 24C

000# LONGITUDINAL TYPE HIGH FREQUENCY PROBE FOR NARROW PITCHED ELECTRODES

BACKGROUND OF THE INVENTION

The present invention relates to a high-frequency probe such that one end of a conductor is pressed to an electrode of a device-under-test (DUT) arranged on a device stage and the other end is connected to the external conductor through a coaxial connector connected to another end of this inner conductor. And in particular, the present invention relates to a high-frequency probe that makes it possible to measure the device not having a ground electrode on a surface of the device-under-test (DUT), to correspond to a device having narrowly-pitched electrodes or multiple pins, and to secure durability by simplification of point conciseness.

Conventionally, in this type of high-frequency probe, as shown in FIGS. 1A through 1C, and FIG. 2, at an end of a probe 100, a signal contact 101 and ground contacts 102 and 102A are contacted with three corresponding device electrodes arranged on the surface of the device-under-test (DUT) 120, which is called as coplanar type. These device electrodes are aligned in a row in the horizontal direction on the surface of the device-under-test (DUT) 120. Normally, as inner conductor 103 positioned in the center of the probe 100 becomes the signal contact 101, and contacts to a signal electrode 113 of the device-under-test (DUT) 120. In addition, a outer conductor 104 of the probe 100 is formed as ground contacts 102 and 102A on the left and right of the signal contact 101 at the end of the probe 100, and contacts to ground electrodes 118 of the device-under-test (DUT) 120.

As shown in FIG. 3, let thickness of the signal electrode 113 of the device-under-test (DUT) 120 be represented by "tsig" and let the thickness of the ground electrode 118 be represented by "tgnd". Usually, as shown in FIGS. 4A through 4C, combination of these thicknesses "tsig" and "tgnd" is "tsig=tgnd" (FIG. 4A), "tsig>tgnd" (FIG. 4B), and "tsig<tgnd" (FIG. 4C). This means that the end of the probe 100 must have elasticity since a uniform pressure amount is necessary for the signal electrode 113 and ground electrode 118 at the end of the probe 100.

Nevertheless, it is difficult to make a coaxial line of the probe 100 have the elasticity. Therefore, with using members having the elasticity as the inner conductor 103 and outer conductor 104, the signal contact 101 and ground contacts 102 and 102A are made to have the elasticity.

In this type of construction, the signal electrode and ground electrode of the device-under-test (DUT) should have the same arranged intervals as those of the probe contacts and should exist on the same plane as that of the probe contacts. Nevertheless, some probe contacts have such construction that the signal electrode and ground electrode are vertically aligned with defining a device stage as the reference ground against a case that the ground electrodes do not exist on the device surface, for example, they are on the back surface. In this case of longitudinal construction, so as to absorb unevenness of height of the device electrodes, a large vertically-movable range is necessary, and hence simple alignment cannot deal with this problem.

In addition, in case the ground electrodes and signal electrode are on a device surface and the arranged intervals of electrodes of a coplanar type device-under-test (DUT) are the same as those of the probe contacts, contact is possible. Nevertheless, distribution of electric force lines at the time of contact differs according to dispersion of electrode height, and in consequence, characteristic impedance of the probe varies. Hence, accurate measurement cannot be performed.

Although the impedance does not change due to electrode height (thickness) at the time of contact if end faces of the ground device electrodes of the device-under-test (DUT) is made to coincide with the end faces of the ground contacts, mutual alignment is difficult. From the viewpoint of the device side, since two ground electrodes should be provided for one signal electrode on the same plane so as to correspond to conventional probe contacts, the size of the device becomes large, and hence cost also increases.

In particular, compound devices such as GaAs devices have wafer cost more expensive than that of silicon. For this reason, in mass-production devices, both of cost reduction and security of high-frequency characteristics are realized by not providing ground electrodes on the same plane, making a chip area small and making wafer thickness thin, and assigning the back side to a ground electrode surface.

If the signal electrode and ground electrodes of the device-under-test (DUT) are apart from each other, the probe contacts can contact to them by making intervals of the probe contacts coincide with those of the device-under-test (DUT). Nevertheless, since the distance between the signal contact and ground contacts changes at an end part of the probe, impedance mismatching arises, and hence accurate measurement cannot be performed.

In order to reduce the influence of this mismatching, electrode length should be shortened. Nevertheless, so as to make the probe have the elasticity, the probe contacts should have some extent of length and thinness. By elongating the probe contacts, the characteristics get worse due to impedance mismatching. Furthermore, thin probe contacts are easily broken by overdrive at the time of contact.

On the other hand, since a body over from a coaxial connector positioning in a base part to the end part has predetermined size, this probe can be applied to device electrodes with inclining the probe against the plane so as to shorten the length of the relatively thin probe contacts. Nevertheless, since the probe contacts deeply bite into the device electrodes due to reduction of the elasticity and overdrive of the probe contacts, damage to the probe contacts becomes large.

In addition, usually, a device having a good high-frequency characteristic has a backside used as a whole-surface ground so as to obtain a good grounding characteristic. In particular, in LSIs (large scale integrated circuits) described later, line width becomes small, and hence the ground surface is approached to the signal lines on the surface by making the device thin so as to obtain a predetermined impedance characteristic, for example, 50Ω. In consequence, the ground electrodes are not on the same plane as that of the signal electrode, and the ground surface exists at a near position in the plane. Therefore, if the ground surface is formed on the whole surface of the backside, the probe having the above-described construction cannot contact.

In addition, conventional probe contacts have such structure that the ground electrode, signal electrode, and ground electrode are horizontally aligned in this order in the direction being perpendicular to the pressure direction at the time of contact to device electrodes. Therefore, this type of probe cannot deal with a case that signal electrodes are aligned in narrow pitches like those of LSI. Although probes that can deal with narrowly-pitched electrodes or multiple pins exist, the ground electrodes are not structurally stretched to the end of each probe. Therefore, since the impedance mismatching, crosstalk between signal electrodes, and the like arise, they cannot be used in high-frequency domains.

As described above, conventional high-frequency probes have the following problems.

A first problem is that correspondence is very difficult or impossible if the signal electrode and ground electrodes of a device-under-test (DUT) such as a microstrip type are not arranged in the same plane.

Its reason is that, since the probe contacts contacting to the device electrodes are horizontally aligned on the same plane and the pitches of the probe contacts coincide with the pitches of device electrodes in such alignment, the probe contacts cannot contact to the device electrodes not having this construction.

A second problem is that, if the signal electrode and ground electrodes of a device-under-test (DUT) such as a microstrip type are not on the same plane, accurate measurement is not performed even if electrode pitches of the device-under-test (DUT) are the same as those of the probe contacts and contact is possible.

Its reason is that the distribution of electric force lines at the time of contact differs according to the degree of unevenness of the device electrode and hence the characteristic impedance of the probe changes. In addition, another reason is that alignment of electrodes is difficult. Furthermore, still another reason is that the probe cannot contact to the device electrodes if the unevenness of the device electrodes exceeds the allowable value of overdrive.

A third problem is that the probes cannot deal with devices having such construction that narrowly-pitched multiple signal electrodes are aligned like those of LSI.

Its reasons are that the aligned order of electrodes of an LSI is not fixed to the order of the ground electrode, signal electrode, and ground electrode, and that pitches of the device electrodes also do not always coincide with the pitches of the probe contacts.

SUMMARY OF THE INVENTION

It is an object of the invention to provide an high-frequency probe that has construction such that a inner conductor has one end part pressed to an electrode of a device-under-test (DUT) arranged on a device stage and another end part connected to an external conductor. On the other hand, each probe has an outer conductor enclosing the inner conductor.

An object of the present invention is to provide a high-frequency probe that is free from the above-described problems, and can deal with a case that a signal electrode and ground electrodes of a device-under-test (DUT) such as a microstrip type are not arranged on the same plane. Furthermore, the high-frequency probe can correspond to narrowly-pitched electrodes and multiple pins, and a characteristic impedance of the probe is not changed even if an electrode part at an end is bent due to a pressure amount caused by contact.

Therefore, let the direction of pressing an inner conductor to an electrode of a device-under-test (DUT) be a vertical direction. And the high-frequency probe according to the present invention comprises an inner conductor, an insulating fixing member, such as substrates of a probe chip or spacers, and a grounding conductive member, such as an electrically conductive outer enclosure, a ground conductor or a main block. The inner conductor has one end part for contacting to a device electrode of a device-under-test (DUT) and another end part connected to an external conductor. The inner conductor has elasticity flexible at least in the vertical direction at the one end part. The insulating fixing member is provided for fixing the end part of the inner conductor therein. The grounding conductive member is connected to ground and arranged at least above and below the inner conductor in the vertical direction at its end part. And the grounding conductive member holds the insulating fixing member so that a contact and pressure side part of the inner conductor can move in the vertical direction with the elasticity of the inner conductor at the time of contact to the device-under-test (DUT).

Owing to such construction, the high-frequency probe according to the present invention can deal with the case that a signal electrode and ground electrodes of a device-under-test (DUT) are not arranged on the same plane, and can correspond to narrowly-pitched electrodes and multiple pins. In addition, this probe can move the end of the probe chip, which becomes a signal contact, in a direction of contact pressure with guide of the electrically conductive outer enclosure and the elasticity of the inner conductor inside the electrically conductive outer enclosure.

Furthermore, the high-frequency probe according to the present invention has thin shape whose maximum thickness in the transverse direction, which is perpendicular to the vertical direction, is made to be equal to a pitch between electrodes of the device-under-test (DUT). Therefore, the probe can be also formed in the construction of laminating a plurality of probes.

In a concrete high-frequency probe according to the present invention like this, a body is a main block, a electrically conductive outer enclosure is attached at an end part, and a ground conductor and a probe chip are arranged inside the electrically conductive outer enclosure. Furthermore, a inner conductor passing through the main block is held at a central position of a space by at least one of spacers.

The main block is a body of the probe, and has a space for arranging the inner conductor in a central part. The probe chip is composed of an end part located at the end part of the inner conductor and obtaining electric conduction by contacting to an electrode of a device-under-test (DUT). And the probe chip having a transmission path as a signal conductive pattern connecting to the inner conductor further connecting to a coaxial connector at a base part of the probe.

The ground conductor is located between the probe chip and this main block, electrically connects to the main block, and also has a longitudinal hole in the vertical direction. Since the inner conductor connecting to the probe chip passes through a space of this hole, this inner conductor can move in the vertical direction in the space part of this hole.

The electrically conductive outer enclosure movably holds the probe chip approximately only in the vertical direction with an inner guide surface, and electrically contacts the outer conductor portion of this probe chip with the ground conductor. In addition, the electrically conductive outer enclosure contacts to at least either of the ground electrodes of the device-under-test (DUT) and the device stage conducting with these ground electrodes. A spacer(s) maintains mutual positional relation of the inner conductor in the internal space of the main block.

The construction like this expands a range of moving the signal electrode formed at the end part toward contact pressure with the elasticity of the inner conductor in the space part formed in the ground conductor. Furthermore, this construction simplifies the construction by making the elasticity of the conductor in the probe chip unnecessary, and restricts movement of the probe chip approximately in the vertical direction inside the electrically conductive outer enclosure. Moreover, this construction avoids fluctuation of the characteristic impedance by restricting bend of the inner conductor within the ground conductor.

BRIEF DESCRIPTION OF THE DRAWINGS

FIG. 8A is a cross-section showing a form of the probe chip shown in FIG. 5.

FIG. 8B is a cross-section showing a form of a cross-section taken on line B—B of FIG. 6.

FIG. 9A is a cross-section showing a form different from the probe chip shown in FIG. 8A.

FIG. 9B is a cross-section showing a form of a cross-section taken on line B—B in FIG. 6 in the case of using the probe chip of FIG. 9A.

FIG. 11 is an enlarged cross-section showing detail of a form of a state that an end part of the probe in FIG. 5 contacts to a microstrip type device-under-test (DUT).

FIG. 12A is a partial perspective view showing a usage pattern at an end part of the high-frequency probe according to the present invention.

FIG. 12B is an explanatory cross-section of FIG. 12A.

FIG. 17A is a partial longitudinal cross-section showing another form of the inner conductor portion shown in FIGS. 16 and 17.

FIG. 17B is a cross-section of FIG. 17A taken along the plane EB—EB.

FIG. 18A is a partial longitudinal cross-section showing still another form of the inner conductor portion shown in FIGS. 16 and 17.

FIG. 18B is a cross-section of FIG. 18A taken along the plane EC—EC.

FIG. 18C is a enlarged view of a section of FIG. 18B.

FIG. 19 is a partial perspective view showing another form of an end part of the probe in FIG. 5.

FIG. 20A is a partial longitudinal cross-section showing a form of the outer enclosure portion with the ground conductor shown in FIG. 5.

FIG. 20B is a cross-section of FIG. 20A taken along the line CA—CA.

FIG. 21A is a partial perspective view showing a usage pattern at an end part in a case that a plurality of high-frequency probes according to the present invention is aligned in parallel.

FIG. 21B is an explanatory cross-section of FIG. 21A.

FIG. 22A is an explanatory cross-section showing a form of a spacer different from the spacer shown in FIG. 6.

FIG. 22B is an explanatory cross-section showing a form of a spacer different from the spacer shown in FIG. 22A.

FIG. 22C is an explanatory cross-section showing a form of a spacer different from the spacer shown in FIGS. 22A and 22B.

FIG. 22D is an explanatory cross-section showing a form of a spacer different from the spacer shown in FIGS. 22A, 22B and 22C.

FIG. 22E is a cross section of FIG. 22D taken along the line S—S.

FIG. 24A is a longitudinal cross-section showing a form of a signal conductive pattern in the probe chip portion shown in FIG. 5.

FIG. 24B is a cross-section of FIG. 24A taken along the line BA—BA.

FIG. 24C is a longitudinal cross-section showing another form of a signal conductive pattern shown in FIG. 5.

FIG. 24D is a cross-section of FIG. 24C taken along the line BB—BB.

DESCRIPTION OF THE PREFERRED EMBODIMENTS

The embodiments of the present invention will be described with reference to drawings.

Figure 5:
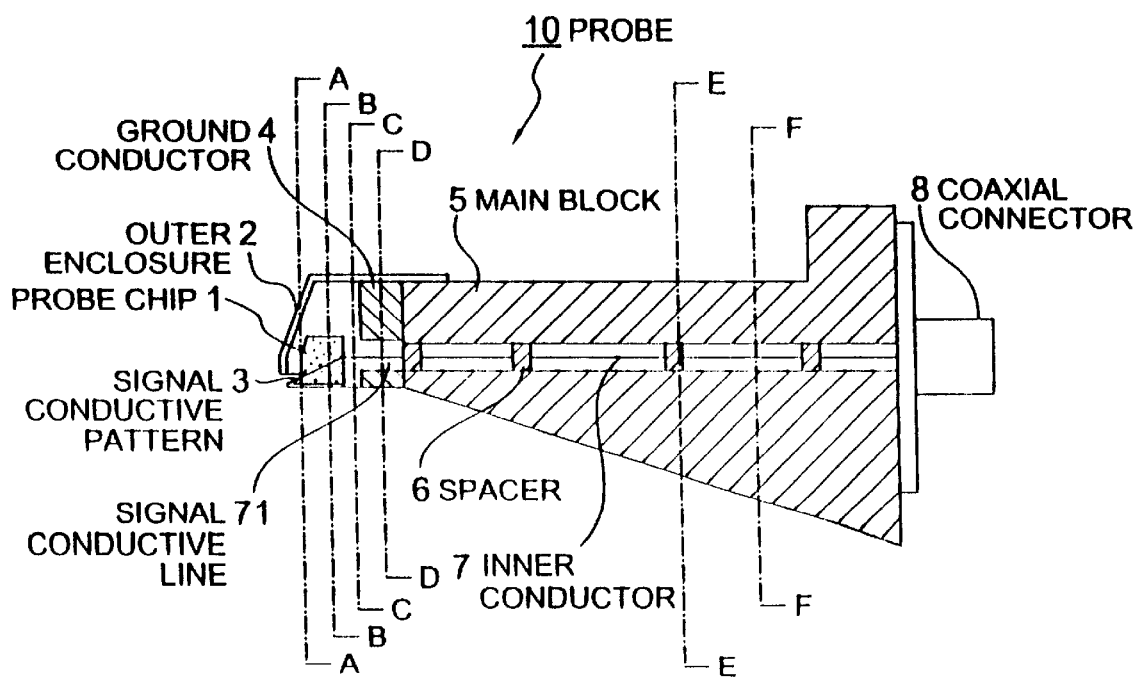
FIG. 5 is a longitudinal cross-section showing the first embodiment of the present invention.

FIG. 5 is a longitudinal cross-section showing an embodiment of the present invention. The illustrated high-frequency probe 10 comprises a probe chip 1, an electrically conductive outer enclosure 2, a signal conductive pattern 3, a ground conductor 4, a main block 5, spacers 6, an inner conductor 7, a coaxial connector 8, and a signal conductive line 71.

The probe chip 1, the ground conductor 4, and the signal conductive line 71 are arranged inside of the outer enclosure 2. The signal conductive pattern 3 is included in the probe chip 1. The signal conductive line 71 connects the signal conductive pattern 3 to the inner conductor 7. The inner conductor 7 is enclosed by an insulation space on the inside of the main block 5. And the inner conductor 7, the signal conductive pattern 71, and the signal conductive pattern 3 construct a signal conductor. As this result, the outer enclosure 2, the main block 5 and the signal conductor form a coaxial transmission line. However, the signal conductor may be constructed by only the inner conductor, or by the combination of them.

Figure 6:
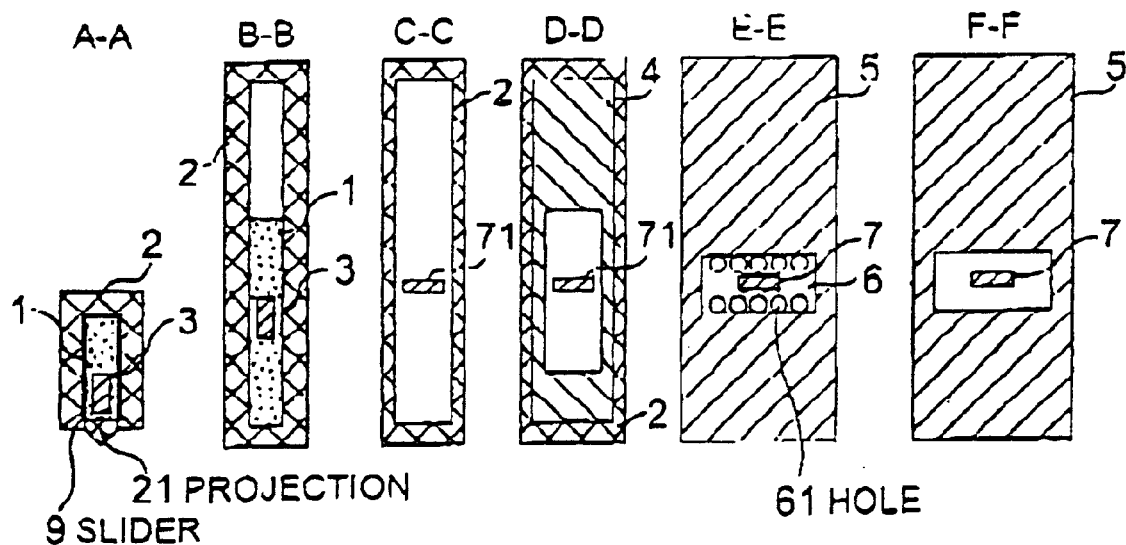
FIG. 6 is a transverse cross-section showing a form in a plurality of main parts in FIG. 5.

FIG. 6 is a transverse cross-section of respective main parts in FIG. 5. A cross-section taken on line A—A and a cross-section taken on line B—B show the cross-section of an end part including the probe chip 1. A cross-section taken on line C—C shows the cross-section of a part of a position between the probe chip 1 and ground conductor 4. And a cross-section taken on line D—D shows the cross-section of a part of the ground conductor 4. In addition, a cross-section taken on line E—E shows the cross-section of the main block 5 including a part of the spacers 6 therein, and a cross-section taken line on F—F shows the cross-section of the main block 5 not including a part of the spacers 6.

As shown in FIG. 6, the high-frequency probe 10 has longitudinal construction whose width is narrower than that of a conventional high-frequency probe.

Referring now to FIGS. 5 through 8B and FIG. 11, the construction of the end part of the high-frequency probe 10 will be described.

Figure 7:
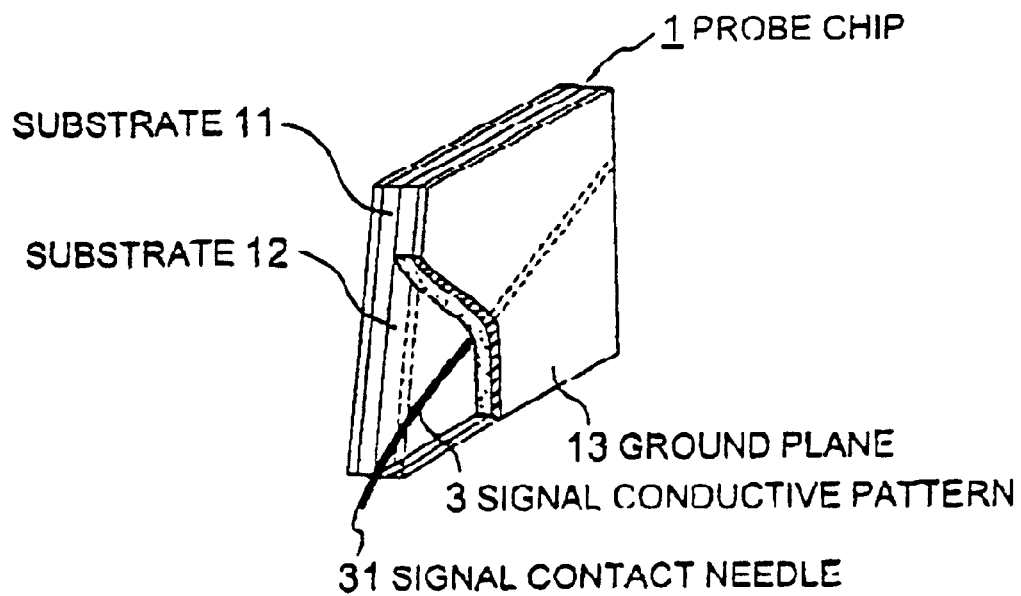
FIG. 7 is a perspective view showing a form of the probe chip shown in FIG. 5 with removing a part of the probe chip.

FIG. 7 is a perspective view of the probe chip 1 with removing a part thereof for explaining the construction thereof. FIG. 8A is a transverse cross-section of the probe chip 1 shown in FIG. 7, and FIG. 8B is a drawing showing detail of a cross-section taken on line A—A of FIG. 6. In addition, FIG. 11 is an explanatory cross-section showing a state in the vicinity of an end part of the probe at the time of use.

The end part, as shown in the cross-section taken on line A—A of FIG. 6, is composed of the probe chip 1 both sides of which are sandwiched by the outer enclosure 2. As the detail is shown in FIGS. 7 and 8B, the probe chip 1 forms stripline construction with a signal conductive pattern 3, arranged between two substrates 11, 12 each having an end part that contacts to an electrode of the device-under-test (DUT) and has tapered shape. And ground planes 13 of both sides formed by the substrates 11, 12 are whole-surface ground.

Both of these ground planes 13 slide by a pressure amount at the time of the end part contacting to a device electrode with keeping electrical connection with the inside of the outer enclosure 2 through a slider 9 that is a conductive buffering-member. A function relating to this slide will be described later with reference to FIG. 11. As the slider 9 that is a buffering member, for example, an indium sheet can be used.

Although the slider 9 is fixed to the inner surface of the outer enclosure 2 in FIG. 8B, a slider 9a can be fixed also to the ground planes 13 of the probe chip 1 as shown in FIGS. 9A and 9B.

The outer enclosure 2 electrically connects the ground planes 13 of the probe chip 1 to the ground conductor 4 and contacts to a ground electrode of a device-under-test (DUT) of a microstrip type or the device stage conducting to the ground electrode of this device-under-test (DUT). In addition, the signal conductive pattern 3 has a signal contact needle 31 in an end thereof which contacts to a device electrode and connects to the inner conductor 7 through the signal conductive line 71 with another end thereof.

The ground conductor 4, as shown in the cross-section taken on line D—D of FIG. 6, has a longitudinal hole, and, as shown in FIG. 5, connects to the main block 5 that is a structural part of a coaxial line. The signal conductive line 71 having the elasticity is arranged in the central part of the hole. The signal conductive line 71, as shown in the drawing and described above, is a wide plate having the elasticity in the vertical direction of the hole.

The main block 5 forms a transmission line with the inner conductor 7 passing through an internal space in the central part. This inner conductor 7 as shown in the cross-sections taken on line E—E of FIGS. 5 and 6 is supported at a position of a central line by the plurality of spacers 6 having predetermined intervals. A concrete example of construction of the main block 5 will be described later with reference to FIGS. 25A and 25B.

The spacers 6 support the inner conductor 7 so that the positional relation between the inner conductor 7 and main block 5 may be fixed with using air as dielectric material, in the transmission line composed of the inner conductor 7 arranged in the internal space. Owing to this fixed relation, the accuracy of the characteristic impedance of the high-frequency probe can be excellently maintained. For the sake of this, the spacers 6 are made to be thin for reducing the influence of spacer insertion to a minimum. Furthermore, as the quality of their material, polyimide resin that is thermally stable resin and has characteristics of a small dielectric constant ∈ and small thermal deformation, or glass-ceramics that has small dielectric loss tangent tan δ is used. In addition, in each of spacers 6 that is dielectric material, as shown in the cross-section taken on line E—E, a through-hole 61 is provided for reducing the fluctuation of the characteristic impedance to a minimum. Another concrete means for the spacers 6 supporting the inner conductor 7 at the predetermined position will be described later with reference to FIGS. 22A through 22D.

The inner conductor 7, as described above, is formed from elastic material in plate-like shape, and has the elasticity in the sliding direction of the probe chip 1. Furthermore, the inner conductor 7 connects to the signal conductive pattern 3 through the signal conductive line 71 with an end, and connects to the coaxial connector 8 with another end, as shown in FIG. 5.

The coaxial connector 8 connects the main block 5 and inner conductor 7 to an outer conductor and an inner conductor of an external coaxial connector respectively.

As described above, the probe chip, which is an end, slides inside a metal case at the time of the high-frequency probe contacting to a device electrode. Nevertheless, this high-frequency probe has such construction that the slidable direction is limited to the vertical direction as described above, and hence the probe chip cannot slide in the transverse direction. Owing to this, since the positional relation between the signal conductive pattern and electrically conductive outer enclosure that construct the stripline does not change also by the slide, the fluctuation of the characteristic impedance does not arise.

Figure 10:
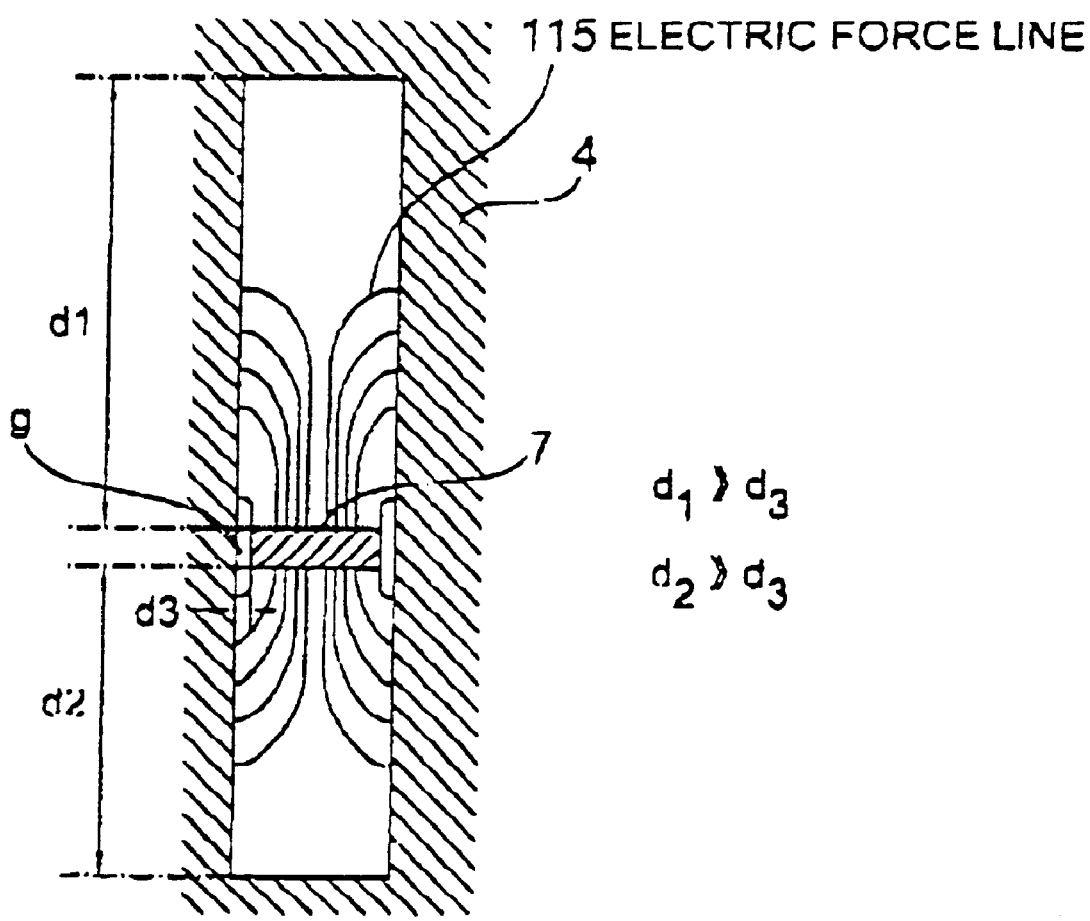
FIG. 10 is an explanatory cross-section showing a form of electric force lines in the ground conductor of FIG. 5.

Referring now to FIG. 10, a hole in the ground conductor 4 will be described with reference to the cross-sections taken on line D—D of FIGS. 5 and 6.

FIG. 10 is a partially enlarged drawing of the above-described cross-sections taken on line D—D that shows an example of distribution of electric force lines 15 in the ground conductor 4.

In the hole part of the ground conductor 4, the bend of the signal conductive line 71 passing through the inside, as described above, arises in the above-described vertical direction with the spacer 6 provided at the end part of the main block 5 as a fulcrum. Therefore, the size of the signal conductive line 71 in the bend direction at the hole of the ground conductor 4, as shown in the FIG. 10, is set so that the distance d1 and the distance d2 may become sufficiently large in comparison with the distance d3. The distance d1 is a distance from the surface of the signal conductive line 71 to an upper part. The distance d2 is a distance from the surface to a lower part. The distance d3 is a distance between the side face of the signal conductive line 71 and the inner side face of the ground conductor 4.

In this manner, a capacitive component g becomes dominant in a value of the characteristic impedance formed with the ground conductor 4 and the signal conductive line 71. The capacitive component g is formed in gaps between the side faces and inner side faces of ground conductors 4 where the electric force lines 15 concentrate. The inner side face of the ground conductor 4 is sufficiently wide for moving of the signal conductive line 71. As a result, even if the signal conductive line 71 moves by bending in the vertical direction, the distance d3 does not change. Therefore, since the dominant capacitive component g does not change, the fluctuation of the characteristic impedance never arises by the bend of the signal conductive line 71 that arises by the end of the high-frequency probe contacting to a device electrode.

Referring now to FIG. 11 through FIG. 12B, construction of the end portion of the high-frequency probe and functions at the end part of the high-frequency probe contacting to a device electrode will be described. The probe chip 1 is contacted to the signal electrode 113 of the microstrip type device-under-test (DUT) 112, and the high-frequency probe 10 is pressed down until a projection 21 provided on the lower face of the electrically conductive outer enclosure 2 collides with the device stage 114. Owing to this operation, the probe chip 1 slides and the signal conductive line 71 is bent with the spacer 6a as a fulcrum, but the characteristic impedance, as described above, is not affected. Since the probe chip 1 contacts to the signal electrode 113 of the device-under-test (DUT) 112 by the projection 21 with the surface of the device stage 114 as a reference level, the contact pressure to the signal electrode 113 can be reproduced at a certain value.

The contact pressure can be obtained with a small bend amount owing to the construction of the signal conductive pattern 3 of the probe chip 1 with inclining to the surface of the device-under-test (DUT) 112 and the signal conductive line 71 bending at a ground conductor 4. Therefore, duration of the high-frequency probe 10 is extended. In addition, the projection 21 contacts to the device stage 114 in the vicinity of the end of the high-frequency probe 10 with the device stage 114 as a ground level that is a ground electrode, and the electrically conductive outer enclosure 2 comprising the projection 21 covers the probe chip 1. As a result, also from the electrical viewpoint, a distributed constant circuit is formed to the end of the high-frequency probe 10 and therefore accurate measurement of electric characteristics can be performed.

The high-frequency probe 10 shown in FIG. 11 has the construction of aligning the ground contacts that are formed by the electrically conductive outer enclosure 2 and sandwich the signal contact composed of the signal conductive pattern 3 in the vertical direction described above. Therefore, as shown in FIGS. 12A and 12B, even if the signal electrode 113 of the device-under-test (DUT) 112 has such construction that the ground electrode is not on the same plane as that of the signal electrode 113, accurate measurement can be performed regardless of arrangement and unevenness of the ground electrode by fetching the ground such as the device stage 114 in the environment as the reference level. In addition, as for the device itself, since it is not necessary to arrange the signal electrode 113 and ground electrode as a pair on the same plane, it becomes possible to reduce a superficial area of a device, and to reduce cost.

Figure 13A:
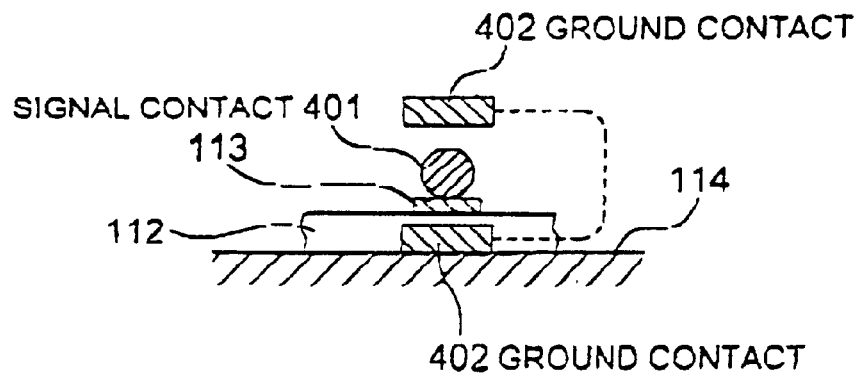
FIG. 13A is an explanatory diagram of a case that a signal contact is arranged between two ground contacts and contacts to a signal electrode of a device-under-test (DUT).
Figure 13B:
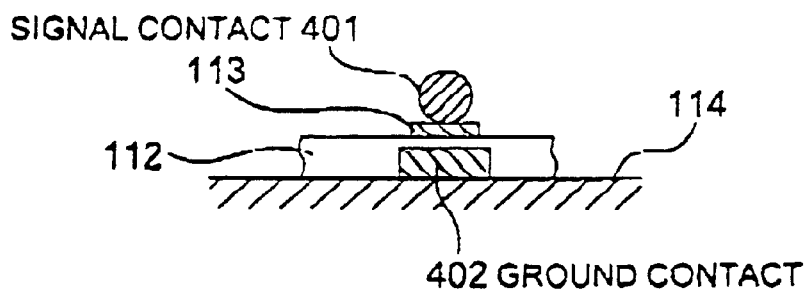
FIG. 13B is an explanatory diagram of a case that the ground contact is provided only for the side of the device-under-test (DUT).
Figure 13C:
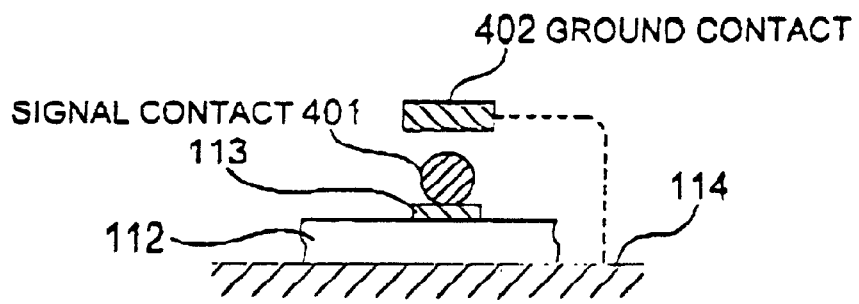
FIG. 13C is an explanatory diagram of a case that the ground contact is provided only for the other side of the device-under-test (DUT).

Referring now to FIG. 13A, 13B, and 13C, impedance matching of the end part of the probe will be described below.

FIG. 13A shows a basic construction for the impedance matching in a case that a signal contact 401 of the end part of the probe collides to a signal electrode 113 of a microstrip type device-under-test (DUT) 112. The probe is arranged as a longitudinal type in which the signal contact 401 is sandwiched by two ground contacts 402 in the vertical direction described above. The impedance matching in the end part of the probe is performed by sandwiching a signal contact 401 with two ground contacts 402 from the both sides. The two ground contacts are formed from the electrically conductive outer enclosure 2 in one body.

FIG. 13B shows a case that only one ground contact 402 directly contacts with the device stage 114 and the other one is cut off by shortening of the end part of the electrically conductive outer enclosure 2. In a case of the constant thickness of the device-under-test (DUT) 112 including the signal electrode 113, the gap between the signal contact 401 and the ground contact 402 becomes constant and then, in the end part of the probe, it's impedance becomes constant. In this case, the end part hanging over a contact point is cut off in the electrically conductive outer enclosure 2 shown in FIG. 11. Therefore, it is easy to see and locate the contact point on the surface of the device-under-test (DUT) 112.

FIG. 13C shows a case that the end part of the electrically conductive outer enclosure 2 is shortened in the side of contacting with the device stage 112, that is, the ground contact 402 contacted with the device stage 114 is cut off. In a case of existence of variety in the thickness of the device-under-test (DUT) 112 including the signal electrode 113, in the end part of the probe, it's impedance matching is performed between the signal contact 401 and the other ground contact hanging over the contact point.

Figure 14A:
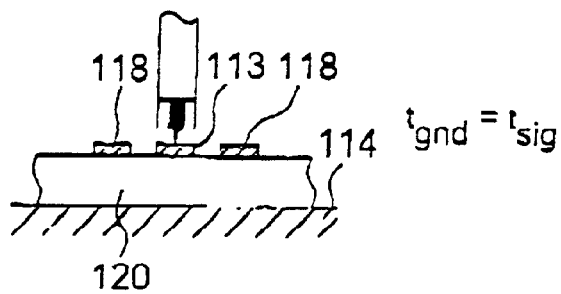
FIG. 14A is an explanatory diagram of a case that the height of a signal electrode from the surface of a device-under-test (DUT) is equal to that of the ground electrodes, as an example of contact states of an end part in a high-frequency probe according to the present invention.
Figure 14B:
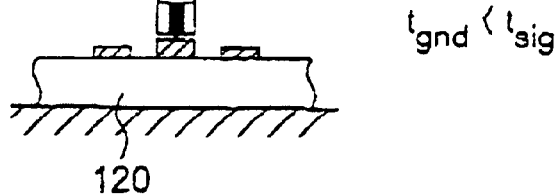
FIG. 14B is an explanatory diagram of a case that the signal electrode is higher than the ground electrodes.
Figure 14C:
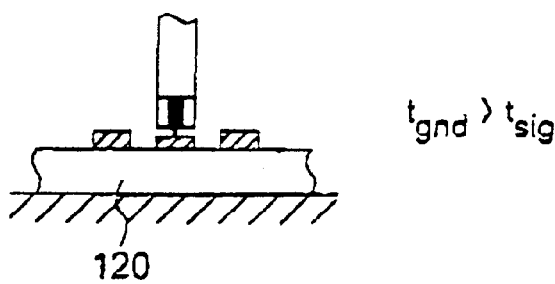
FIG. 14C is an explanatory diagram of a case that the signal electrode is lower than the ground electrodes.

Referring to FIGS. 14A, 14B, and 14C, thickness of the device electrodes of the coplanar type device-under-test (DUT) 120 will be described in a case of the probe corresponding to FIG. 13C.

Figure 1A:
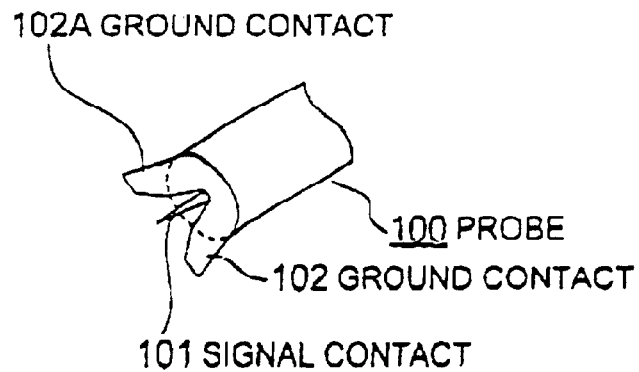
FIG. 1A is a perspective view showing an example of an end part of a conventional high-frequency probe.
Figure 1B:
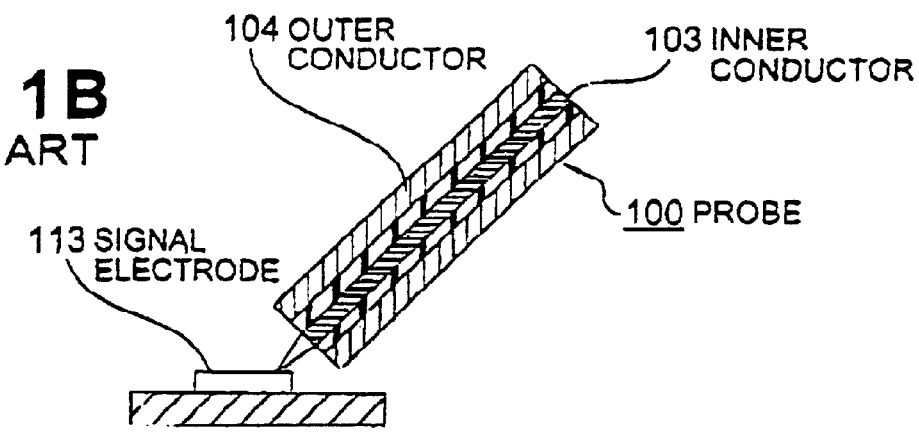
FIG. 1B is a cross-section of the part at the time of contact.
Figure 1C:
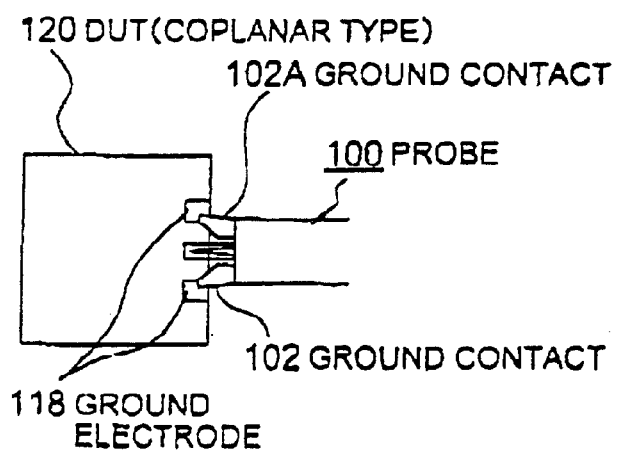
FIG. 1C is a plan of the part at the time of contact.
Figure 2:
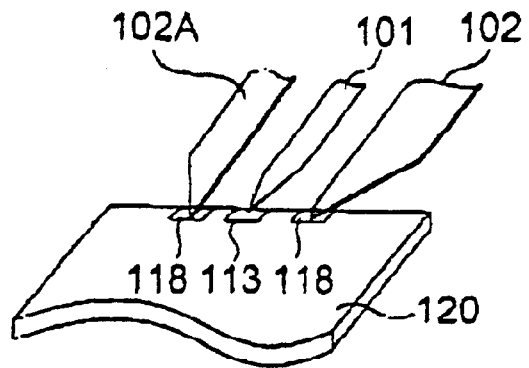
FIG. 2 is a perspective view of the end part, shown in FIG. 1C, at the time of contact.
Figure 3:
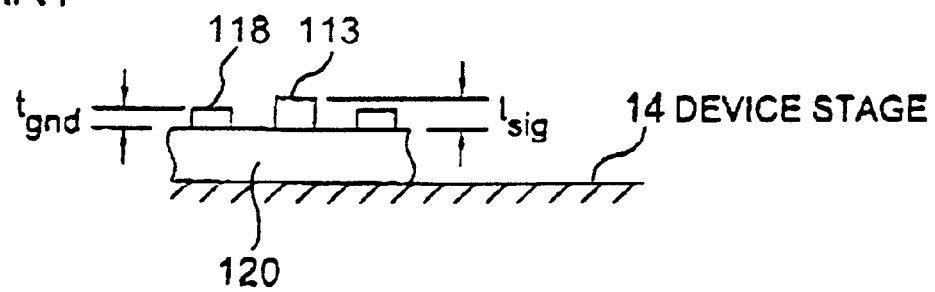
FIG. 3 is an explanatory front view showing a form of a signal electrode and ground electrodes of a device-under-test (DUT) that is an object of a conventional example.
Figure 4A:
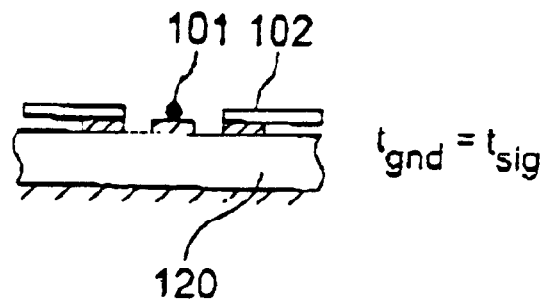
FIG. 4A is an explanatory diagram of a case that the height of a signal electrode from the surface of a device-under-test (DUT) is equal to that of the ground electrodes, as an example of contact states of an end part in a conventional high-frequency probe.
Figure 4B:
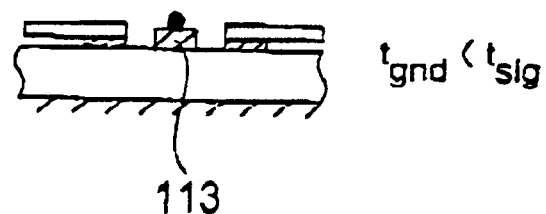
FIG. 4B is an explanatory diagram of a case that the signal electrode is higher than the ground electrodes.
Figure 4C:
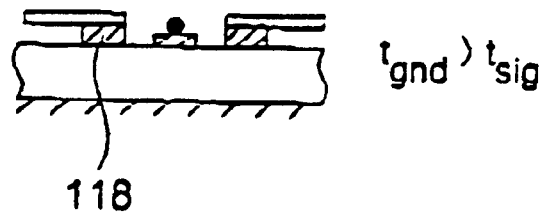
FIG. 4C is an explanatory diagram of a case that the signal electrode is lower than the ground electrodes.

A signal electrode 113 of a device-under-test (DUT) 120 has thickness "tsig" and a ground electrode 18 has thickness "tgnd", and these are the same as those shown in FIGS. 4A, 4B, and 4C. Nevertheless, difference of this embodiment from conventional high-frequency probes is that the end of the high-frequency probe 10 contacts only to the signal electrode 113 with the device stage 114 as the reference level in any of the following cases. Thus, these cases are a case that the thickness "tsig" of the signal electrode 113, as shown in FIG. 14A, is equal to the thickness "tgnd" of the ground electrode 118, a case that the thickness "tsig", as shown in FIG. 14B, is larger than the thickness "tgnd", and a case that the thickness "tsig", as shown in FIG. 14C, is smaller than the thickness "tgnd". Owing to this, differing from a conventional probe, this embodiment is never affected by the relative value between the thickness "tsig" of the signal electrode 113 of the device-under-test (DUT) 112 and the thickness "tgnd" of the ground electrode 118. The probe chip that is the end of the high-frequency probe 10 absorbs the unevenness of the thickness "tsig" itself of the signal electrode 113 by means of bend in the vertical direction, and the fluctuation of the characteristic impedance also, as described above, does not arise.

Figure 15:
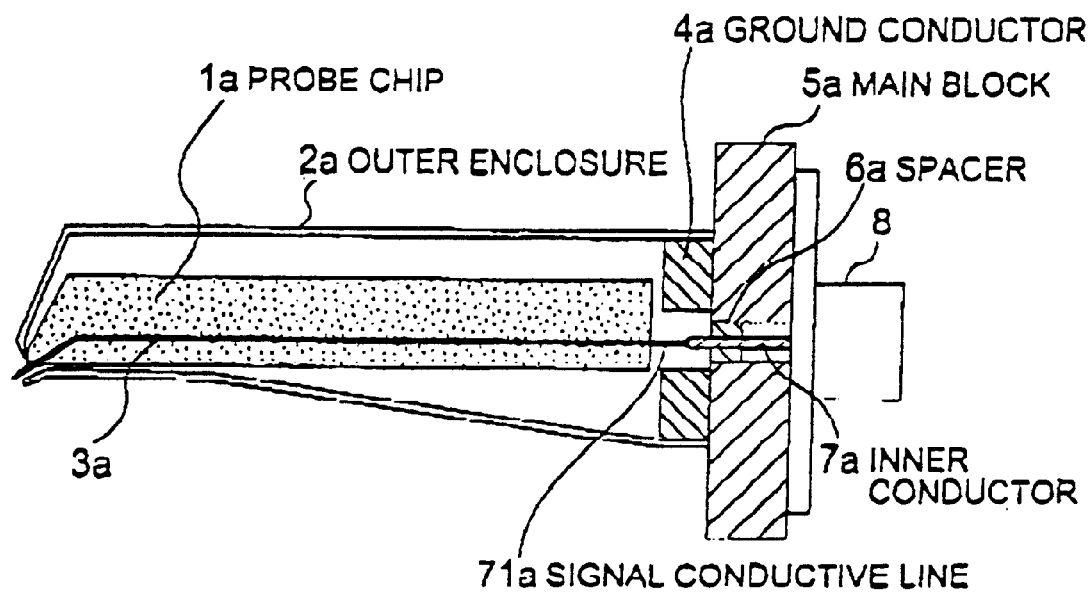
FIG. 15 is a longitudinal cross-section showing another form including a probe chip and a main block different from the probe chip and the main block shown in FIG. 5.

Referring now to FIG. 15, another embodiment of this invention will be described below.

This probe comprises a probe chip 1a, an electrically conductive outer enclosure 2a, a signal conductive pattern 3a, a ground conductor 4a, a main block 5a, a spacer 6a, a inner conductor 7a, a coaxial connector 8, and a signal conductive line 71a. In this case shown in FIG. 15, the transmission line of the probe chip 1a is longer and the transmission line of the main block 5a is shorter comparing to the lengths shown in FIG. 5, respectively. The other points of this embodiment are the same as shown in FIG. 5. As described above, the signal conductive line 71a may be a part of the inner conductor 7a.

Figure 16A:
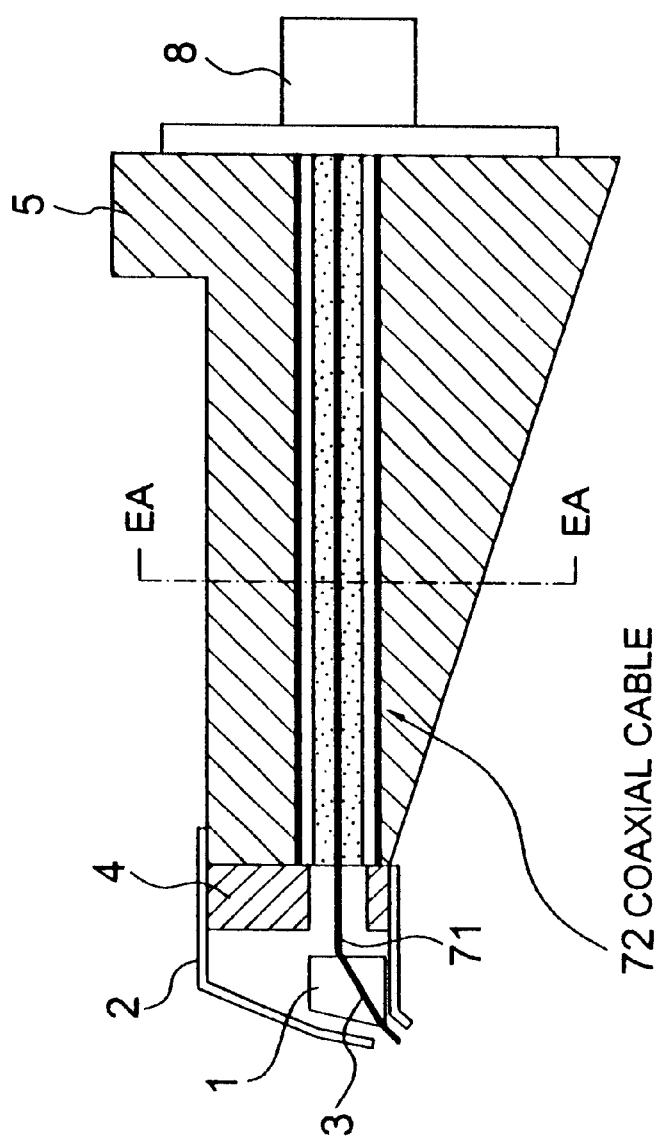
FIG. 16A is a longitudinal cross-section showing a form of an inner conductor portion different from the inner conductor portion in the main block shown in FIG. 5.
Figure 16B:
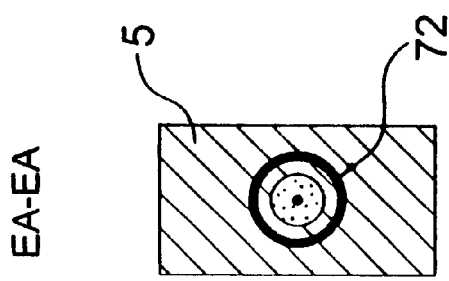
FIG. 16B is a cross-section of FIG. 16A taken along the plane EA—EA.

Referring to FIG. 16, still another embodiment of this invention will be described below.

This probe uses a coaxial cable 72 instead of the spacers 6, the inner conductor 7 and the space being like the pipe formed in the central part by the main block 5 shown in FIG. 5. The coaxial cable 72 has an outer conductor and an inner conductor, each of which is fixing and connecting electrically to the coaxial connector 8 in one end part. The other end part of the inner conductor electrically connects to the signal conductive pattern 3 through the signal conductive line 71. The signal conductive line 71 shown in FIG. 16 may be replaced to the inner conductor exposed from the coaxial cable 72. As described above, the signal conductive line 71 may be a part of the inner conductor of the coaxial cable 72.

Referring to FIG. 17, a different spacer 6b will be described. The spacer 6b is filled up with dielectric instead of the spacers 6 and the internal space of the main block 5 formed like the pipe shown in FIG. 5.

Referring to FIG. 18, another different spacer 6c will be described. The spacer 6c is a plate-like shaped substrate. In the spacer 6c, an inner conductor 7 on one side plane and a ground plane 4c on the other side plane are formed. The spacer 6c maintains the inner conductor 7 in the central position of the internal space of the main block 5. The ground plane 4c is fixed and electrically connected to the main block 5.

Referring now to FIG. 19, construction of the end portion of the high-frequency probe will be described.

This end portion comprises an outer enclosure 2d, an inner conductor 7d, and signal contact 73 which is an end portion of the inner conductor 7d. And the inner conductor 7d directly contacts to the signal electrode 113 by the signal contact 73. By this arrangement, construction of the end part of the high-frequency probe can be made to simplify greatly. Furthermore, even if any bending of the inner conductor 7d occurs at the time of contact to the device-under-test (DUT), distance or position relation between the side face of the inner conductor 7d and the inner side face of the electrically conductive outer enclosure 2d does not change. Therefore, the fluctuation of the characteristic impedance never arises.

Referring to FIG. 20, construction of outer enclosure portion will be described below.

The end part of the high-frequency probe shown in FIG. 20 comprises the probe chip 1, an electrically conductive outer enclosure 2e, the signal conductive pattern 3, and a signal conductive line 71e. In this construction, the ground conductor 4 shown in FIG. 11 is included in the ground conductor. Consequently, the construction of the electrically conductive outer enclosure 2e is made to obtain the same distribution of the electric force line as shown in FIG. 10 formed between the signal conductive line 71e and itself. As the results, the fluctuation of the characteristic impedance in the transmission line never arises for the bending of the signal conductive line 71e at a time of contact with the device-under-test (DUT) and construction of the end part of the high-frequency probe can be made to simplify. Of course, as described above, the signal conductive line 71e may be a part of the inner conductor 7e.

Referring to FIGS. 21A and 21B, a structural example of the high-frequency probe will be described.

FIG. 21A is a structural perspective view for explaining a first embodiment, and FIG. 21B is an explanatory cross-section of FIG. 21A. The high-frequency probe 10 shown in FIG. 21A corresponds to the device-under-test (DUT) 112 where multiple signal electrodes 113 are arranged in narrow pitches by unifying a plurality of probes in the horizontal direction as a set.

Although the end of the high-frequency probe 10 comprises ground contacts sandwiching the signal contact in the vertical direction as described above, it is possible to deal by means of the construction of unifying the plurality of probes even if multiple signal electrodes 113 are aligned like those of LSI. In this case, since a single probe is a high-frequency probe 10 having the elasticity in the midst of the transmission line, each single probe can absorb the height difference of respective pins of the signal electrodes 113. Therefore, it becomes possible to simplify the fixing construction of the high-frequency probe 10. In addition, since the outer enclosure 2 as a conductor encloses the signal conductive line 71, it is possible to reduce the influence of crosstalk and to use the high-frequency probe 10 in a high-frequency domain.

In addition, as shown in FIG. 21B and described above, the projection 21 contacts to the signal electrode 113 of the device-under-test (DUT) 112 with the surface of the device stage 114 as the reference level, and hence the contact pressure to the signal electrode 113 can be reproduced at a certain value.

Referring now to FIGS. 22A through 22E, various type of spacers will be described.

FIG. 22A is a cross-section of a spacer part showing an example of using a spacer 6fa having the construction different from that of the spacer 6 of the FIG. 6.

What is used as the spacer 6fa is the material, which has a small dielectric constant and dielectric loss tangent and is sufficiently strong, for example, polyimide resin that is thermally stable resin. Furthermore, the spacer 6fa holds the inner conductor 7 at a predetermined position with stretching the resin, formed in thin rope-like shape, in the vertical and transverse directions. Since the space between the inner conductor 7 and main block 5 of ground level is almost occupied by air and its depth can be small, local fluctuations of the characteristic impedance of the transmission line can be minimized.

In addition, FIG. 22B is a cross-section of a spacer part showing an example of using a spacer 6fb having the construction different from that of the above-described spacers 6 or 6fa.

The spacer 6fa has the construction of reducing the rate, which the dielectric material occupies, against the spacer 6fa. Thus, as shown in the drawing, this spacer 6fb has such construction that the spacer 6fb holds the inner conductor 7 at the predetermined spatial position from inner side faces of the main block 5 facing to the spacer in the thickness side of the plate-like inner conductor 7. Furthermore, in the construction, the dielectric material is arranged at a minimum in the side of the flexural direction of the inner conductor 7, that is, both sides of the plate-like conductor, whose direction is the above-described vertical direction. In particular, this is effective in suppressing the fluctuation of the characteristic impedance if the distance between the inner conductor 7 and inner side faces is small in the side of both sides of the plate-like inner conductor 7 which are in the bend direction.

FIG. 22C is a cross-section of a spacer part showing an example of using a spacer 6ga having the construction different from that of the above-described spacers 6, 6fa, or 6fb. The spacer 6ga is thin in thickness and is filled up the space between the inner conductor 7 held at the predetermined spatial position and inner side faces of the main block 5 with the dielectric material. The spacer 6ga itself does not need a process except making of a hole to hold the inner conductor 7. Therefore, the manufacture is easy and then cost reduction can be realized.

FIGS. 22D and 22E are cross-sections of a spacer part showing an example of using a spacer 6gb having the construction different from that of the above-described spacers 6, 6fa, 6fb, or 6ga. The spacer 6gb is made thin hollow except faces contacting with the inner conductor 7 held at the predetermined spatial position and with inner side faces of the main block 5 in the spacer 6ga. As this result, occupancy quantity of the dielectric material can be reduced.

Figure 23A:
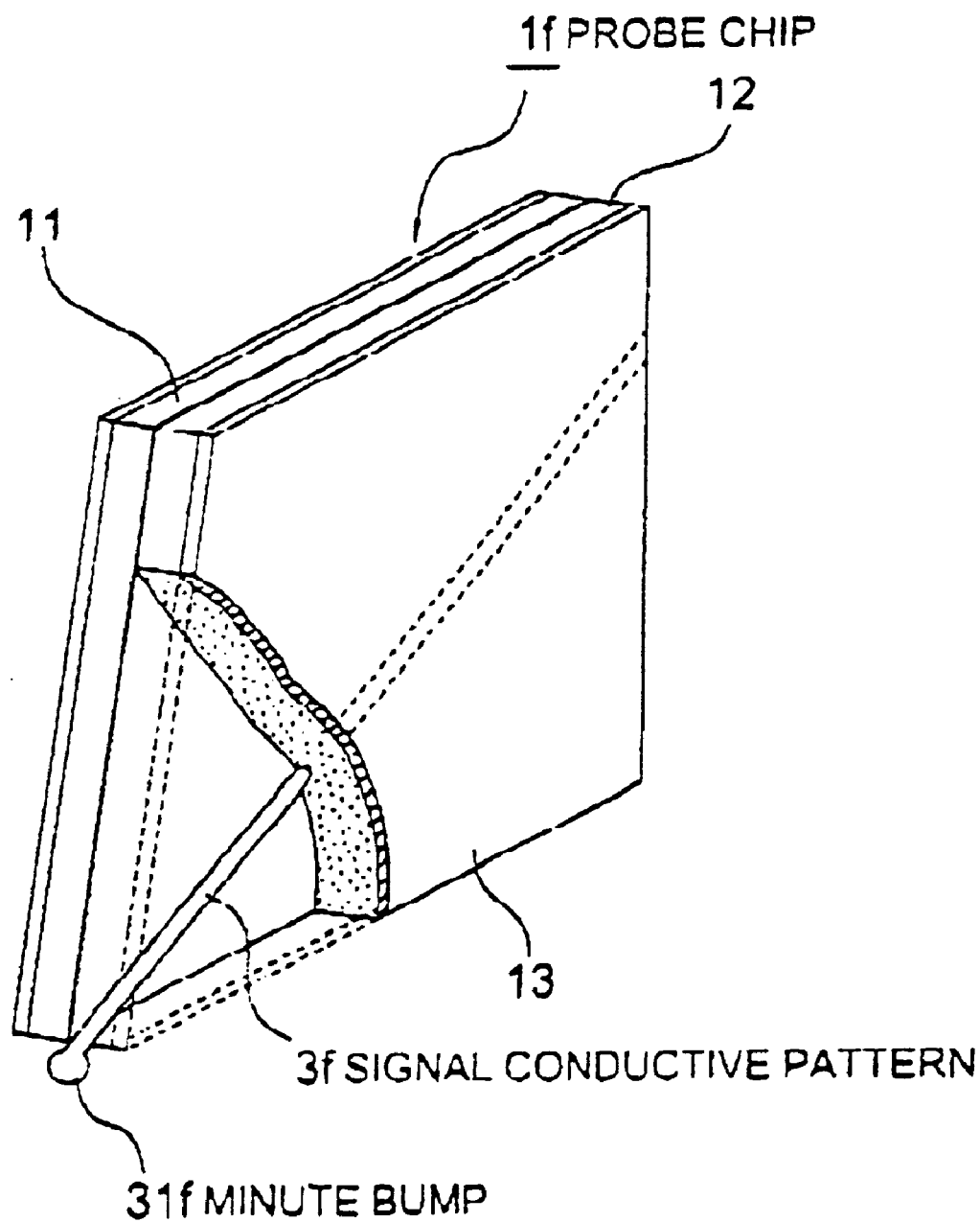
FIG. 23A is a perspective view showing a form of a probe chip different from the probe chip shown in FIG. 7 with removing a part of the probe chip.
Figure 23B:
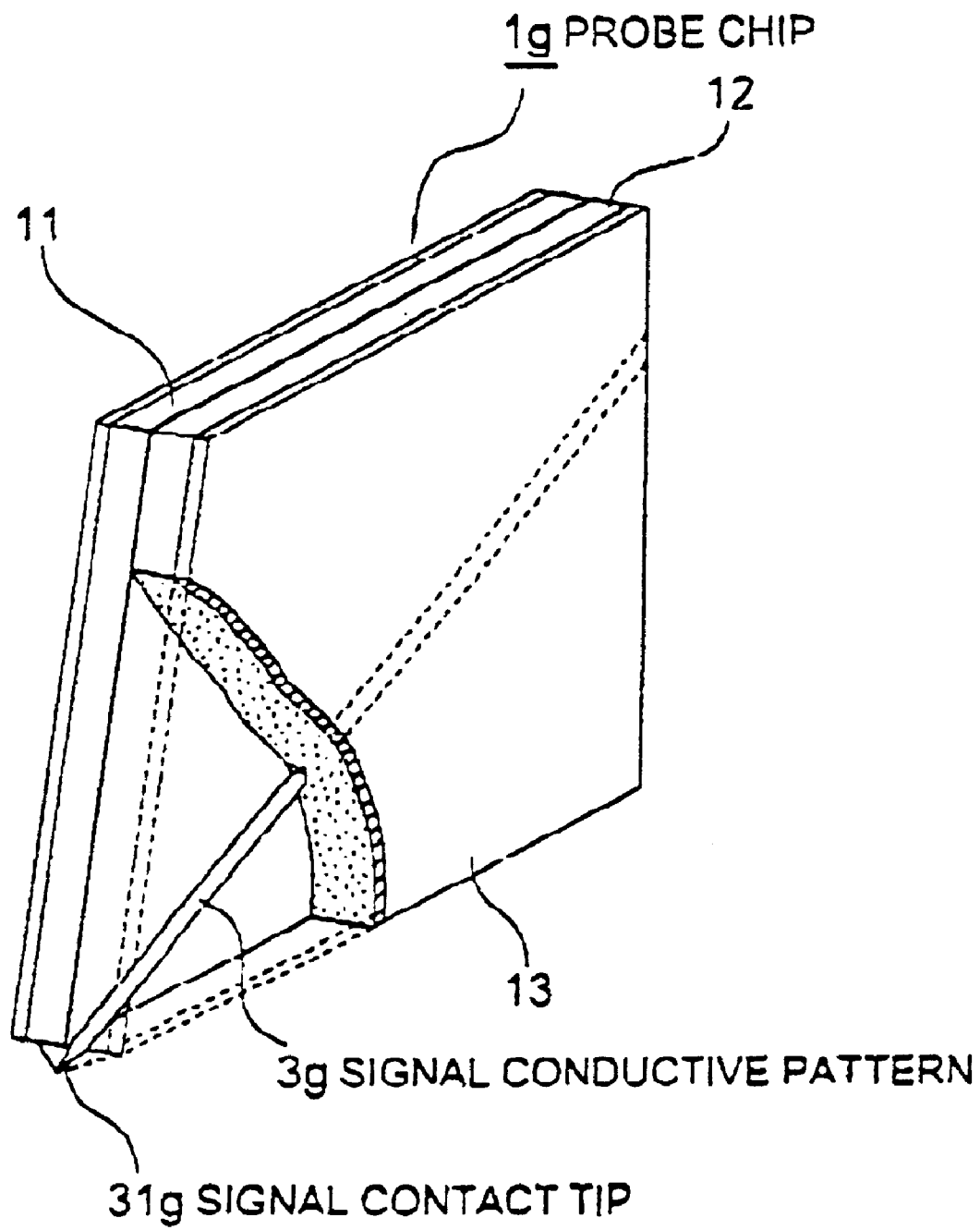
FIG. 23B is a perspective view showing a form of a probe chip different from the probe chip shown in FIG. 23A.

Referring now to FIGS. 23A and 23B, probe chips 1f and 1g different from the probe chip 1 of FIG. 7 will be described regarding to the end contact part.

As shown in FIG. 23A, the probe chip 1f is the same as that of the probe chip 1 of FIG. 7 that a stripline is formed with the signal conductive pattern 3f arranged between the two substrates 11, 12 and both sides of ground planes 13 of the substrates 11, 12. Difference from the probe chip 1 is that a half-cut through-hole is formed at the chip end against the tapered shape of the probe chip 1, and a minute bump 31f is attached to this part. This minute bump 31f contacts to a device electrode.

As shown in FIG. 23B, the probe chip 1g is the same as that of the above probe chip 1f except a signal conductive pattern 3g and signal contact tip 31g. An end part of the substrate 11, 12 that contact to an electrode of the device-under-test (DUT) has tapered shape and is formed a conductive pattern of metal film which is the signal contact tip 31g connected to the end part of the signal conductive pattern 3g. According to such construction, it is not necessary to process any assembly for installation of the signal contact needle shown in FIG. 7 or the minute bump 31f shown in FIG. 23A in the end part of the probe chip 1g.

Referring now to FIGS. 24A and 24B, probe chips 1f and 1g different from the probe chip 1 of FIG. 7 will be described regarding to the signal conductive pattern part.

As shown in FIGS. 24A–24D, the probe chip 1h or 1i is the same as that of the probe chip 1 of FIG. 8A excepting of width of signal conductive pattern. That is, the signal conductive pattern 3h is a wide type, and the other signal conductive pattern 3i is a rod type. Normally, the width of the signal conductive pattern is decided so as to make impedance 50Ω. However, it is possible to correspond to any device for the high impedance input for example, by changing the width of the signal conductive pattern to the narrower.

Figure 25A:
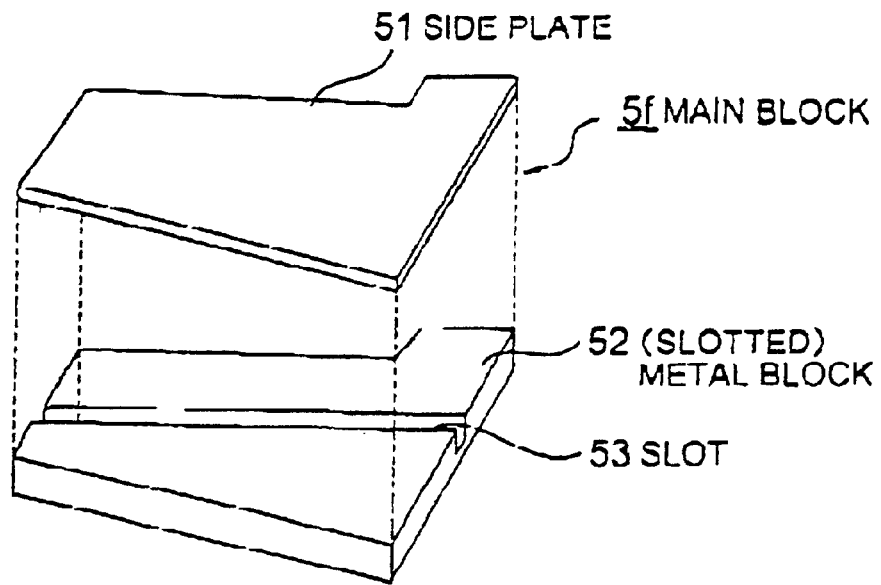
FIG. 25A is an exploded perspective view showing another form of construction of the main block shown in FIG. 5.
Figure 25B:
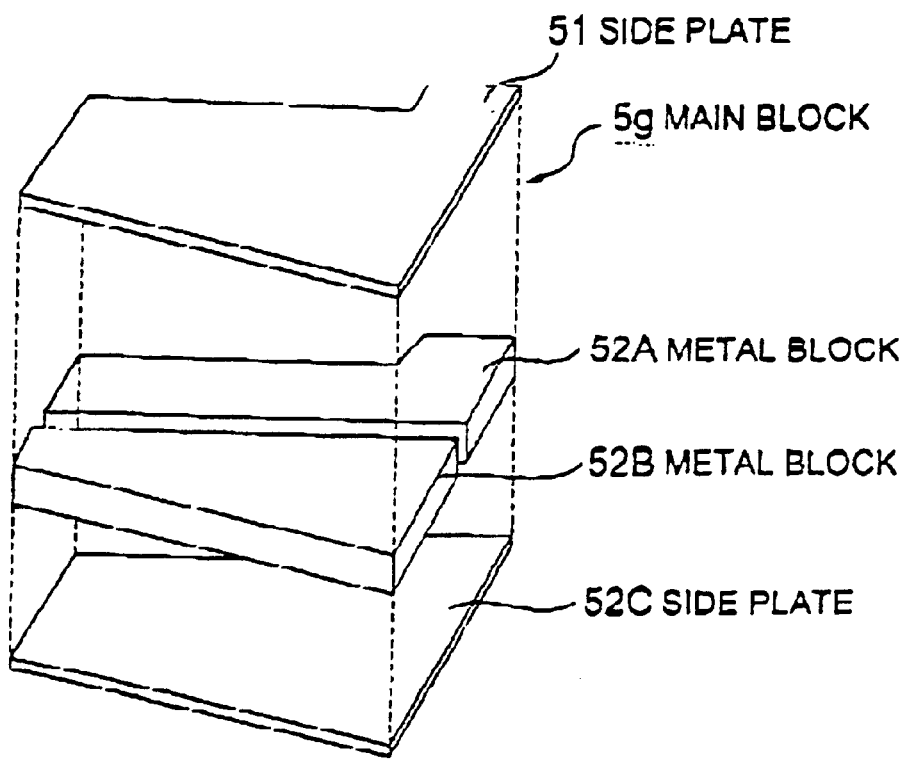
FIG. 25B is an exploded perspective view showing still another form of the part shown in FIG. 25A.

Referring to FIGS. 25A and 25B, the concrete construction of the main block 5 in FIG. 5 will be described.

FIG. 25A is an exploded perspective view showing a main block 5f as a concrete structural example. The main block 5f comprises a side plate 51 and a slotted metal block 52. The side plate 51 is a plate having a highly-accurate side face, contacting to the slotted metal block 52, and the same shape as that of the slotted metal block 52. The slotted metal block 52 is a plate having a slot 53, which has depth equal to width and has no winding, and the shape of the longitudinal cross-section of a high-frequency probe. It is possible to remove an error of the opening diameter and to maintain uniformity accurately in the direction of the transmission line through which the inner conductor, which is arranged inside, is made to pass, by bonding and screwing the side plate 51 and the slotted metal block 52.

FIG. 25B is an exploded perspective view showing a main block 5g as a structural example different from the above-described structural example. The main block 5g comprises the side plate 51 and metal blocks 52A and 52B, and a side plate 52C. The metal blocks 52A and 52B and side plate 52C are those into which the slotted metal block 52 in the main block 5g is broken down. Therefore, their shape after assembly becomes the same as that of the slotted metal block 52. In this manner, manufacturing cost can be reduced by constructing the main block 5g using parts with the shape of being easily worked.

These metal blocks 52A and 52B each have a surface that has uniform flatness and forms a slot or an opening part at the time of assembly. In addition, side plates 51 and 52C are plates having highly-accurate surfaces facing to each other and having the same shape. At the time of assembly, it is possible to maintain the accuracy of the opening diameter with using standard blocks.

Figures 26A, 26B:
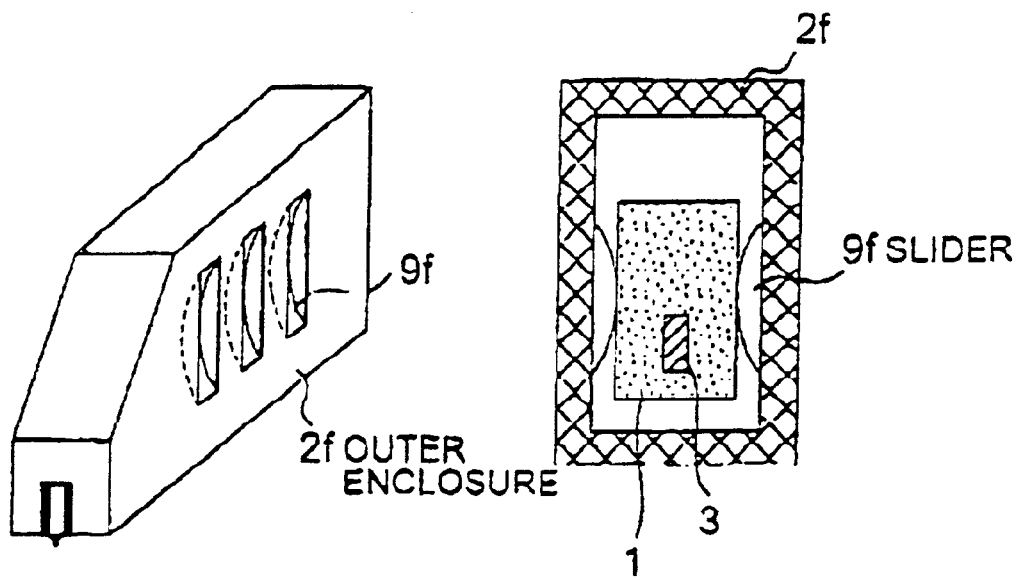
FIG. 26A is a perspective view showing another form of the electrically conductive outer enclosure and slider shown in FIG. 5.
FIG. 26B is a transverse cross-section of FIG. 26A.

Referring to FIGS. 26A and 26B, a slider 9f, which is a sliding means between the probe chip and electrically conductive outer enclosure and is different from the sliders shown in FIGS. 5 through 9B, will be described.

FIG. 26A is an outward appearance of a electrically conductive outer enclosure 2f, and FIG. 26B is a transverse cross-section of the electrically conductive outer enclosure 2f and an inside thereof. The electrically conductive outer enclosure 2f is flexible material, and its part slidably contacting to the probe chip 1 forms a slider 9f with curving toward the inside. Although the slider 9f has the shape of fixing both ends in the same direction against the vertical direction, in which the probe chip 1 slides, in the drawing, the shape like a cantilever spring that one end part is positioned inside can be used.

Figure 27A:
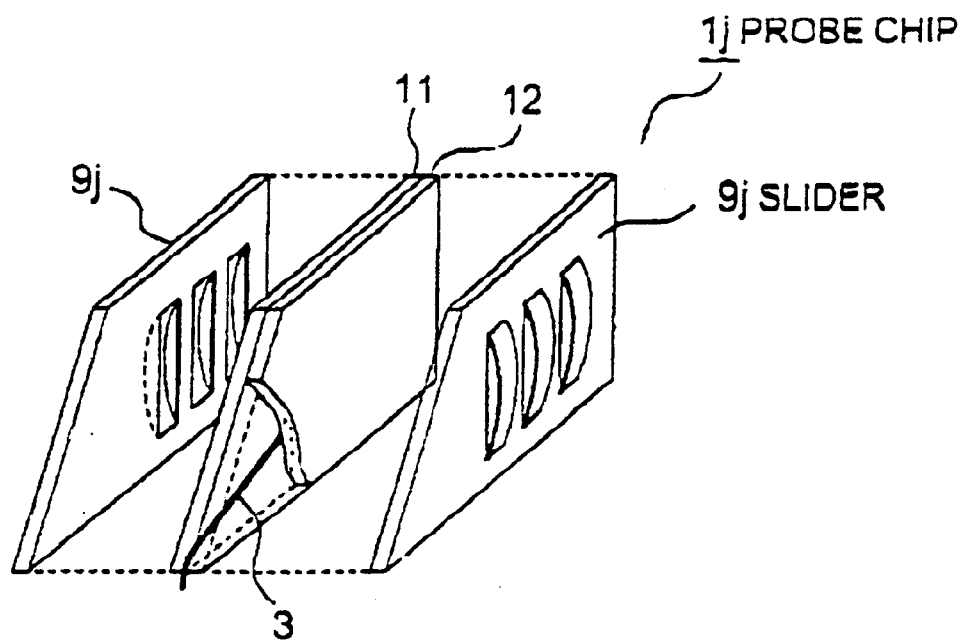
FIG. 27A is a perspective view showing another form of construction of a probe chip with slider different from the probe chip shown in FIG. 7.
Figure 27B:
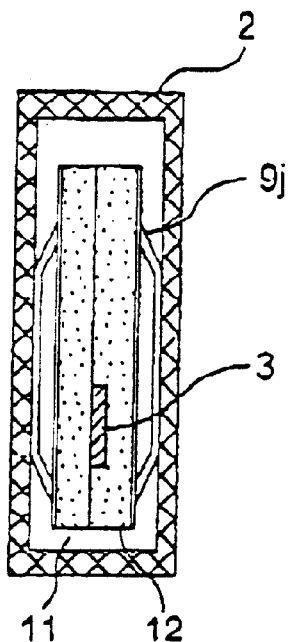
FIG. 27B is a transverse cross-section of FIG. 27A.

Referring to FIGS. 27A and 27B, sliders 9j, which are a sliding means between a probe chip 1j and the electrically conductive outer enclosure 2 shown in FIG. 5, and is different from the sliders shown in FIGS. 5 through 26B will be described.

FIG. 27A is an exploded perspective view showing the probe chip 1j, and FIG. 27B is a transverse cross-section of the assembled probe chip 1j and an inside thereof. As shown in drawings, the sliders 9j are mounted in the probe chip 1j by sandwiching the substrates 11, 12. Accordingly, the sliders 9j themselves form ground conductors of the probe chip 1j by contacting to the electrically conductive outer enclosure 2 that contacts to the device ground electrode.

Figure 28:
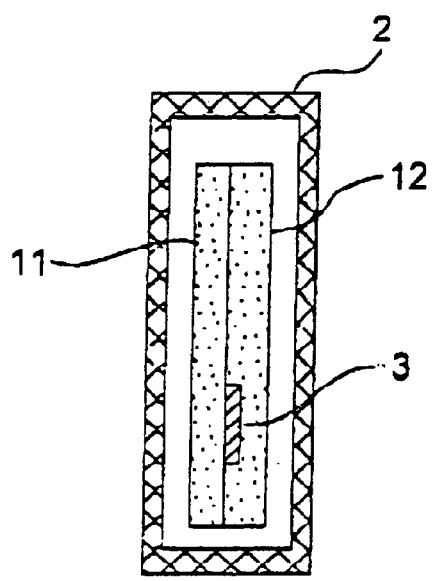
FIG. 28 is a cross-section showing still another form of a cross-section taken on line B—B of FIG. 6.

Also, as shown in FIG. 28, the electrically conductive outer enclosure 2 may be the ground conductor of the naked probe chip comprising the signal conductive pattern 3 and the substrates 11, 12 without any slider.

In addition, although, in the above description, the shape of the inner conductor is plate-like, other shape having the elasticity, for example, cylindrical shape can be used, and hence the through-hole also can have the shape suitable to this shape.

In this manner, although, in the above description, shape and construction are described with drawings, the shape, material, and electrical performance of components are free so long as they meet the above-described functions. Therefore, the above description does not limit the present invention.

As described above, according to the present invention, the following effects can be obtained.

A first effect is that high-frequency measurement is possible even if a ground electrode is not on the same plane as that of a signal electrode in a device-under-test (DUT).

Its reason is that the high-frequency probe according to the present invention has the construction of the ground contact being vertically aligned with the signal contact with assuming that a direction of the signal contact being contacted and pressed is a vertical direction. Owing to this, accurate measurement can be performed with the ground, existing in the device stage and the like, as a reference level. In consequence, another effect occurs, the effect that a device has not a ground electrode formed with being paired with the signal electrode.

A second effect is that the high-frequency probe according to the present invention can be formed in the construction having sufficient strength in comparison with a conventional probe.

Its reason is that the inner conductor connecting to a base of the probe chip, which is an end, at the time of contacting to the device has the elasticity, and the probe chip performs sliding movement inside the electrically conductive outer enclosure fixed. In addition, since the hole of the ground conductor largely opens vertically and the probe chip, which is the end part, becomes vertically movable, impact damage to the device electrode, which is a mate of contact, can be avoided.

A third effect is that a constant pressure amount to the device electrode, which is a mate of contact, can be obtained.

Its reason is that the projection, which is a lower surface of the electrically conductive outer enclosure and has no elasticity, can be applied to a reference level of contact. For example, the projection can be applied to the device stage as the reference level.

A fourth effect is that the fluctuation of the characteristic impedance of the high-frequency probe can be avoided.

Its reason is that, since the ground plane of the probe chip and the inner surface of the electrically conductive outer enclosure slide with sandwiching the slider inside the electrically conductive outer enclosure and keeping electrical contact, at the end part at the time of the electrode in the end of the high-frequency probe contacting to a device electrode, the positional relation between the signal conductive pattern and ground electrode is constant without collapsing. Furthermore, the reason is that, since the opening space around the inner conductor bent with the elasticity is sufficiently large in the bend direction in the ground conductor, the characteristic impedance of the transmission line formed with only side faces is constant.

A fifth effect is that the present invention can correspond to a device having multiple pins like an LSI.

Its reason is that, since the high-frequency probe has such shape that the thickness in the direction, which is perpendicular to the direction of contact pressure, is equal to or less than a pitch between pins or electrodes, that is, so-called longitudinal shape, a plurality of high-frequency probes can be arranged.

What is claimed is:

1. A high-frequency probe for use in testing a device-under-test which has a ground electrode on a device stage, and a signal electrode formed on the device-under-test (DUT) at a level different in a vertical direction from the ground electrode, said probe comprising:

a main block;

an inner conductor which has one end part extending from said main block and having a tip for contacting the signal electrode of the device-under-test and another end part connected to an external conductor, said inner conductor having elasticity flexible at least in a vertical direction at said one end part, a direction of contacting and pressing said inner conductor to said device electrode being said vertical direction;

an insulating fixing member supported on said one end part of said inner conductor, a portion of said one end part of said inner conductor being included within said insulating fixing member; and a grounding conductive member which is connected to ground, which is arranged to have ground contacts for contacting the ground electrode of the device-under-test when the inner conductor is contacted with the signal electrode at the different level in the vertical direction;

said grounding conductive member slidably holding said insulating fixing member so that said one end part of said inner conductor can move in said vertical direction with the elasticity of said inner conductor, a support between the main block and the inner conductor acting as a fulcrum at the time of contact to the device-under-test.

2. A high-frequency probe for use in testing a device-under-test which has a ground electrode on a device stage, and a plurality of device electrodes formed on the device-under-test (DUT) at a level different in a vertical direction from the ground electrode, said probe comprising:

an inner conductor having one end part included within a probe chip and having a tip arranged to be pressed to at least one of a plurality of the device electrodes of the device-under-test at the level different in the vertical direction from the ground electrode, and another end part connected to an external conductor through a coaxial connector, and an outer conductor which encloses said one end part of said inner conductor included in said probe chip, wherein, the direction of pressing said inner conductor to said device electrode being decided as the vertical direction, said high-frequency probe is operable as a high-frequency probe element structured such that parts of said outer conductor are arranged as ground contacts for contacting the ground electrode on the device stage of the device-under-test and the one end part has a thin shape having a maximum thickness in a transverse direction perpendicular to said vertical direction, said maximum thickness being practically equal to a pitch between said electrodes.

3. A high-frequency probe according to claim 2, comprising a plurality of high-frequency probe elements which are spaced apart from one another in correspondence to at least either of narrowly-pitched electrodes and multiple pins arranged on the DUT.

4. A high-frequency probe as claimed in claim 2, wherein said inner conductor part is one body material which has elasticity in said vertical direction and which is maintained at a position apart from ground conductor parts.

5. A high-frequency probe comprising at least one high-frequency probe element, said high-frequency probe element comprising:

a main block having an internal space;

an inner conductor arranged in a central part of said internal space of said main block and having a portion extending from said main block;

a probe chip that is disposed on said portion of said inner conductor extending from said main block and having a conductive end part for contacting a device electrode of a device-under-test, an insulating substrate, and a signal conductive pattern laid on the substrate, and said probe chip being operable as an end portion of said inner conductor;

at least one spacer maintaining mutual positional relation of said inner conductor in said internal space of said main block;

a ground conductor located between said probe chip and the main block electrically connects to said main block, and has a longitudinal hole having a part through which said inner conductor passes for contacting a signal electrode of the device-under-test; and an electrically conductive outer enclosure that encloses said probe chip, electrically connects as an outer conductor portion of said probe chip with said ground conductor, and contacts disposed above and below said probe chip to engage at least a ground electrode of a device-under-test or a device stage conducting with the ground electrode;

said inner conductor having elasticity in said vertical direction at said part of said longitudinal hole of said ground conductor such that vertical movement occurs upon contact with the signal electrode of the device-under-test and said probe chip disposed on said inner conductor slides vertically within the outer enclosure, the spacer serving as a fulcrum for a flexing portion of the inner conductor.

6. A high-frequency probe as claimed in claim 5, wherein said inner conductor is formed by a leaf spring having elasticity except for the signal conductive pattern of said probe chip.

7. A high-frequency probe as claimed in claim 5, wherein said inner conductor is formed by a leaf spring having elasticity which can move said inner conductor in said vertical direction except for a fixed portion of said inner conductor in said internal space of said main block.

8. A high-frequency probe as claimed in claim 5, wherein said internal space of said main block including an inner conductor part and spacers is replaced by a coaxial cable having said inner conductor and an outer conductor electrically connecting to said main block.

9. A high-frequency probe as claimed in claim 8, wherein said inner conductor of said coaxial cable connects electrically to said signal conductive pattern of said probe chip through the signal conductive line having elasticity and can move said probe chip in said electrically conductive outer enclosure in said vertical direction.

10. A high-frequency probe as claimed in claim 5, wherein said inner conductor is placed to keep mutual positional relation by a dielectric material having a predetermined dielectric constant and filling up said internal space of said main block as said spacer.

11. A high-frequency probe as claimed in claim 5, wherein said inner conductor is formed on a surface of one side of the substrate as said spacer while a ground plane covers the whole surface on the other side of the substrate, and said ground plane is electrically connected to said main block.

12. A high-frequency probe as claimed in claim 5, wherein said electrically conductive outer enclosure and said ground conductor are structured in one body construction.

13. A high-frequency probe as claimed in claim 5, wherein said signal conductive pattern of said probe chip has a thickness matched with an input/output impedance of a device-under-test (DUT).

14. A high-frequency probe as claimed in claim 5, wherein said spacer is formed by a thin dielectric material having a predetermined dielectric constant and has a plurality of through-holes in itself.

15. A high-frequency probe as claimed in claim 5, wherein said spacer is formed by a thin dielectric ring having predetermined-quality of material and has construction of fixing said inner conductor in a predetermined space inside said main block.

16. A high-frequency probe as claimed in claim 5, wherein said spacer has an end part embedded in said main block and supports both plane sides of said inner conductor that is plate-shaped, said spacer forming a space on sides facing to wide front-back sides and fixing said inner conductor in a predetermined position in the space.

17. A high-frequency probe as claimed in claim 5, wherein said spacer is formed by a thin dielectric having a predetermined dielectric constant and a shape with even face.

18. A high-frequency probe as claimed in claim 5, wherein said spacer is formed by a predetermined dielectric material and has a thin shape except for supporting portions thereof contacting with said inner conductor and said main block.

19. A high-frequency probe as claimed in claim 5, wherein said probe chip has construction of arranging a signal conductive pattern on substrates each of which has a tapered end part contacting to an device electrode of a device-under-test (DUT), forms stripline construction with providing a ground plane as a outer conductor on its back side, and connects this signal conductive pattern to a inner conductor in said ground conductor part, said end part of said high-frequency probe further comprises a slider that is arranged between a ground plane of said probe chip and an inner side face of said electrically conductive outer enclosure and has conductivity, and has construction of contacting said ground plane to said inner surface of said electrically conductive outer enclosure and sliding on said inner surface of said electrically conductive outer enclosure with sandwiching said slider, when said end part moves inside said electrically conductive outer enclosure by a pressure amount occurring at the time of contacting to an electrode of the device-under-test (DUT).

20. A high-frequency probe as claimed in claim 19, wherein said signal conductive pattern of said probe chip has a minute metal bump contacting to device electrode in an end part thereof.

21. A high-frequency probe as claimed in claim 19, wherein said signal conductive pattern of said probe chip forms a metal film contacting to device electrode in said tapered end part thereof.

22. A high-frequency probe as claimed in claim 19, wherein said slider is formed by an indium sheet.

23. A high-frequency probe as claimed in claim 19, wherein said slider forms a sheet and is fixed to a ground plane of said probe chip.

24. A high-frequency probe as claimed in claim 19, wherein said slider is a part of said electrically conductive outer enclosure which has at least a curving face toward said probe chip thereon.

25. A high-frequency probe as claimed in claim 19, wherein said slider is a ground plane part of said probe chip which has at least a curving face toward said electrically conductive outer enclosure.

26. A high-frequency probe as claimed in claim 5, wherein said main block comprises a slotted metal block having a slot which has depth equal to width and has no undulation, and a side plate that forms said space with contacting to this slotted metal block and has a highly-accurate side face contacting to the slotted metal block.

27. A high-frequency probe as claimed in claim 26, wherein said slotted metal block are composed of two metal blocks having surfaces that face to each other, have uniform flatness, and a slot forming said space at the time of assembly, and two side plates that form said space with contacting to these metal blocks from both sides and have surfaces that contact to the metal blocks and have low profile irregularity.

* * * * *